US008601417B2

(12) United States Patent
Gowda et al.

(10) Patent No.: US 8,601,417 B2
(45) Date of Patent: Dec. 3, 2013

(54) DECOMPOSITION BASED APPROACH FOR THE SYNTHESIS OF THRESHOLD LOGIC CIRCUITS

(75) Inventors: Tejaswi Gowda, Tempe, AZ (US); Sarma Vrudhula, Chandler, AZ (US)

(73) Assignee: Arizona Board of Regents for and on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 13/090,796

(22) Filed: Apr. 20, 2011

(65) Prior Publication Data

US 2011/0214095 A1    Sep. 1, 2011

Related U.S. Application Data

(63) Continuation-in-part of application No. PCT/US2009/061355, filed on Oct. 20, 2009.

(60) Provisional application No. 61/106,789, filed on Oct. 20, 2008.

(51) Int. Cl.
*G06F 17/50* (2006.01)

(52) U.S. Cl.
USPC .......................... 716/107; 716/101; 716/104

(58) Field of Classification Search
USPC ................... 716/101, 102, 104, 107
See application file for complete search history.

(56) References Cited

U.S. PATENT DOCUMENTS

2002/0184174 A1   12/2002   Kadri

FOREIGN PATENT DOCUMENTS

WO        2010048206 A1     4/2010

OTHER PUBLICATIONS

Yexin Zheng, "Novel RTD-Based Threshold Logic Design and Verification," Thesis submitted to the Faculty of Virginia Polytechnic Institute and State University in partial fulfillment of the requirements for the degree of Master of Science, Apr. 28, 2008, pp. 1-49, Blacksburg, Virginia.*
Avedillo, M. et al., "A Threshold Logic Synthesis Tool for RTD Circuits," In Euromicro Sym. on Dig. Syst. Design, Aug.-Sep. 2004, 4 pages.
Avouris, P. et al., "Carbon nanotube electronics," Proceedings of the IEEE, 91(11) pp. 1772-1784, Nov. 2003.
Beiu, V. et al., "VLSI implementations of threshold logic-a comprehensive survey," In IEEE Transactions on Neural Networks, vol. 14, pp. 1217-1243, Sep. 2003.
Blair, E. P. et al., "Quantum-dot cellular automata: an architecture for molecular computing," In Proc. of SISPAD, pp. 14-18, Sep. 2003.

(Continued)

*Primary Examiner* — Vuthe Siek
(74) *Attorney, Agent, or Firm* — Withrow & Terranova, P.L.L.C.

(57) ABSTRACT

Systems and methods for identifying a Boolean function as either a threshold function or a non-threshold function are disclosed. In one embodiment, in order to identify a Boolean function as either a threshold function or a non-threshold function, a determination is first made as to whether the Boolean function satisfies one or more predefined conditions for being a threshold function, where the one or more predefined conditions include a condition that both a positive cofactor and a negative cofactor of the Boolean function are threshold functions. If the one or more predefined conditions are satisfied, a determination is made as to whether weights for the positive and negative cofactors are equal. If the weights for the cofactors are equal, then the Boolean function is determined to be a threshold function. Further, in one embodiment, this threshold function identification process is utilized in a threshold circuit synthesis process.

11 Claims, 20 Drawing Sheets

(56) References Cited

OTHER PUBLICATIONS

Celinski, P. et al., "State of the art in CMOS threshold logic VLSI gate implementations and systems," In Proceedings of the SPIE, pp. 53-64, Apr. 2003.

Dertouzos, M., "Threshold Logic: A Synthesis Approach," MIT Press, pp. 1-7, Aug. 1965.

Edenfeld, D. et al., "International Technology Roadmap for Semiconductors," 2003. 20 pages.

Gowda, T. et al., "Decomposition Based Approach for Synthesis of Multi-level Threshold Logic Circuits," Design Automation Conference, Mar. 21, 2008, pp. 125-130.

Gowda, T. et al., "Identification of Threshold Functions and Synthesis of Threshold Networks," IEEE Transactions on Computer Aided Design of Integrated Circuits and Systems, vol. 30 No. 5, May 2011, 13 pages.

Gowda, T. et al., "A non-ilp based threshold logic synthesis methodology," In Proc. of the IWLS, 8 pages, May-Jun. 2007.

Gowda, T. et al., "Combinational equivalence checking for threshold circuits," In Proc. of the ACM GLSVLSI, pp. 102-107, Mar. 2007.

Gowda, T. et al., "Synthesis of threshold logic using tree matching," In Proc. of ECCTD, 4 pages, Aug. 2007.

Hatchel et al., "Logic Synthesis and Verification Algorithms," Boston: Kluwer Academic Publishers, pp. 194-196, 1996.

Hopcroft, J. et al., "Synthesis of Minimal Threshold Logic Networks," IEEE Transactions on Electronic Computers, vol. EC-12 No. 4, Aug. 1, 1995, pp. 552-560.

International Search Report for PCT/US2009/061355 mailed May 5, 2011, 4 pages.

Kohavi, Z et al.. "Switching and Finite Automata Theory," New York: McGraw-Hill Book Company, 2009, pp. 173-202.

Likharev, K. K., "Single-electron devices and their applications," Proceedings of the IEEE, 87(4) pp. 606-632, Apr. 1999.

Luba, T., "Multi-Level Logiv Synthesis Based on Decomposition," Microprocessors and Microsystems, IPC Business Press Ltd., London, vol. 18 No. 8, Oct. 1, 1994, pp. 429-437.

Muroga, S., "Threshold Logic and Its Applications," New York: WILEYINTERSCIENCE, 1971.

Sentovich, E. et al. "SIS: A System for Sequential Circuit Synthesis," Technical Report, Department of EECS, UC Berkley, CA, pp. 112-441, 1992.

Zhang, R. et al., "Synthesis and Optimization of Threshold Logic Networks with Application to Nanotechnologies," Design, Automation and Test in Europe Conference and Exhibition, 2004, Proceedings, Feb. 16, 2004, vol. 2, pp. 904-909.

Zhang, R. et al., "Threshold Network Synthesis and Optimization and Its Application to Nanotechnologies," In IEEE Transactions on CAD, pp. 107-118, Jan. 2005.

* cited by examiner

| X | Y | WEIGHTED SUM | Z |
|---|---|---|---|
| 0 | 0 | 0 | 0 |
| 0 | 1 | -1 | 0 |
| 1 | 0 | 1 | 1 |
| 1 | 1 | 0 | 0 |

| ALGORITHM 1: PSEUDO CODE OF ISTHRESHOLD($F$) |
|---|

1   ISTHRESHOLD($F$) ;
    INPUT : $F$ is a pointer to a BDD or MLFT node.
    OUTPUT: $\phi$ if $F$ is not a threshold function. Otherwise, if $F$ is indentified as a threshold function then it is a pair [$W$, $T$] where $W$ is a dictionary with the care variables as keys and weights as values. $T$ is the threshold. [$W$, $T$] is the weight-threshold assignment to $F$.

// Terminal Cases
2   if $F$ == 1 then return ([$\phi$, 0]) ;
3   if $F$ == 0 then return ([$\phi$, 1]) ;
    // if result already cached, return it.
4   [$W$, $T$] = CACHELOOKUP ($F$) ;
5   if [$W$, $T$] ≠ $\phi$ then return ([$W$, $T$]) ;
6   $x$ = $F.var$ ;
    // Check support set containment
7   if ($S_{F_x} \not\subseteq S_{F_{x'}}$) or ($S_{F_{x'}} \not\subseteq S_{F_x}$) then return ($\phi$) ;
    // Check cofactor containment
8   if $F_{x'} \not\leq F_x$ or $F_x \not\leq F_{x'}$ then return ($\phi$) ;
    // Process cofactors
9   [$W_x$, $T_x$] = ISTHRESHOLD ($F_x$) ;
10  if [$W_x$, $T_x$] == $\phi$ then return ($\phi$) ;
11  [$W_{x'}$, $T_{x'}$] = ISTHRESHOLD ($F_{x'}$) ;
12  if [$W_{x'}$, $T_{x'}$] == $\phi$ then return ($\phi$) ;
    // Both cofactors are Threshold
13  if EQUALWEIGHTS ($W_x$, $W_{x'}$) then
14     $W$ = $W_x$ ;
15     $W[x]$ = $T_{x'}$ - $T_x$ ;
16     $T$ = $T_{x'}$ ;
17     CACHE([$W$, $T$], $F$) ;
18     return [$W$, $T$] ;
19  if DIFFWAVVYORDERING ($W_x$, $W_{x'}$) then return (($\phi$))
20  else return (TRYEQUALIZEWEIGHTS($F$)) ;

*FIG. 15*

| ALGORITHM 1: PSEUDO CODE OF TRYEQUALIZEWEIGHTS |
|---|

```
1  TRYEQUALWEIGHTS(F)
       INPUT : F is a pointer to a BDD or MLFT node.
       OUTPUT: A weight vector and a threshold that is valid for both cofactors of F,
       otherwise ϕ.
       // Note: Weights of Fx and Fx' are different but with the same wavy ordering
       // Get the weight and threshold pair for each cofactor.
2  x = F.var ;
   // Support set of one cofactor contains don't care variables of other cofactor.
3  if (S_Fx ≠ S_Fx'), then
4      [W, T] = RESYNTHESIZEWEIGHTS(F)) ;
5      if [W, T] ≠ ϕ then
6          CACHE(([W, T]),F) ;
7          return [W, T] ;
8  else
       // Supports are equal
9      [Wx, Tx] = CACHELOOKUP(Fx) ;
10     [Wx', Tx'] = CACHELOOKUP(Fx') ;
       // Check if weights of Fx valid for Fx'.
11     [L, U] = GETVALIDTHRESHOLDS (Wx, Fx') ;
12     if [L, U] ≠ ϕ then
13         W = Wx ; W[x] = L - Tx ; T = L ;
14         CACHE([W, T], F) ;
15         return [W, T] ;
       // Check if weights of Fx' are valid for Fx .
16     [L, U] = GETVALIDTHRESHOLDS (Wx', Fx) ;
17     if [L, U] ≠ ϕ then
18         W = Wx' ; W[x] = Tx' - U ; T = Tx' ;
19         CACHE(([W, T]), F) ;
20         return ([W, T]) ;
21     [L1, U1] = GETVALIDTHRESHOLDS (Wx' + Wx, Fx) ;
22     if [L1, U1] ≠ ϕ then
23         [L0, U0] = GETVALIDTHRESHOLDS (Wx' + Wx, Fx') ;
24         if [L0, U0] ≠ ϕ then
25             W = Wx + Wx' ; W[x] = L0 - U1 ; T = L0 ;
26             CACHE(([W, T]), F) return [W, T];
27     return ϕ
```

FIG. 16

ALGORITHM 3: Algorithm to determine if the given weights $W$ is valid for the BDD/MLFT $F$ (threshold function)

1 GETVALIDTHRESHOLDS($W$, $F$) ;
    INPUT : $F$ is a pointer to a BDD or MLFT node. $W$ is a dictionary. The keys are variables in the support set of $F$ and the values are the weights.
    OUTPUT: An interval indicating the range of valid thresholds if $F$ is a threshold function, otherwise False.
2   if $F == 1$ then return $[-\infty, \Sigma_{x[W[x]<0}W[x]]$ ;
3   if $F == 0$ then return $[\Sigma_{x[W[x]<0}(W[x]) + 1, \infty]$ ;
4   if $|\Sigma_{x \in W \cap DC(F)} W[x]| \geq \min\{|W[y]|, y \in S_F\}$ then
5     return $\phi$
6   if $\exists x \in S_F \ni |W[x]| \leq 0$ then
7     return $\phi$
8   $x = F.var$ ;
9   $I_1$ = GETVALIDTHRESHOLDS ($W - W[x]$, $F_x$) ;
10  $I_0$ = GETVALIDTHRESHOLDS ($W - W[x]$, $F_{x'}$) ;
11  return $(I_1 + W[x]) \cap I_0$

*FIG. 17*

ALGORITHM 4: Algorithm to resynthesize weights to accommodate don't cares

1 RESYNTHESIZEWEIGHTS($F$) ;
    INPUT : $F$ is a pointer to a BDD or MLFT node.
    OUTPUT: A weight and threshold pair $[W, T]$.
2   $x = F.var$ ;
3   $[W_x, T_x]$ = CACHELOOKUP $(F_x)$ ;
4   $[W_{x'}, T_{x'}]$ = CACHELOOKUP $(F_{x'})$ ;
5   if $S_{F_x} \supset S_{F_{x'}}$ then
6     $W_{DC} = W_x \backslash W_{x'}$ ;
7     $K = 1 + \Sigma_{y \in W_{DC}} |W_x[y]|$ ;
8     $W_{x'}^{new} = K * W_{x'} \cup W_{DC}$ ;

9     $T_{x'}^{new} = K * W_{x'} + \Sigma_{y \in S_{F_{x'}}, |W_{x'}[y] < 0} W_{x'}^{new}[y]$ ;

10    $[L, U]$ = GETVALIDTHRESHOLDS $(W_{x'}^{new}, F_x)$ ;
11    if $[L, U] = \phi$ then return $\phi$ ;
12    $W = W_{x'}^{new}$ ;
13    $W[x] = T_{x'}^{new} - U$ ;
14    return $[W_x, T_{x'}^{new}]$ ;
15 else
16    $W_{DC} = W_{x'} \backslash W_x$ ;
17    $K = 1 + \Sigma_{y \in W_{DC}} |W_{x'}[y]|$ ;
18    $W_x^{new} = K * W_x \cup W_{DC}$ ;
19    $T_x^{new} = K * T_x + \Sigma_{y \in S_{F_x}, |W_x[y] < 0} W_x^{new}[y]$ ;
20    $[L, U]$ = GETVALIDTHRESHOLDS $(W_x^{new}, F_{x'})$ ;
21    if $[L, U] = \phi$ then return $\phi$ ;
22    $W = W_x^{new}$ ;
23    $W[x] = L - T_x^{new}$ ;
24    return $[W, L]$

*FIG. 18*

DECOMPOSITION BASED APPROACH FOR THE SYNTHESIS OF THRESHOLD LOGIC CIRCUITS

PRIORITY CLAIM

This application is a Continuation-in-Part of PCT patent application Ser. No. PCT/US09/61355, filed on Oct. 20, 2009, which claims the benefit of U.S. Provisional Patent Application Ser. No. 61/106,789, filed Oct. 20, 2008, the disclosures of which are hereby incorporated herein by reference in their entireties and are made part of this specification.

GOVERNMENT FUNDING

This invention was made with government support under 0702831 awarded by the National Science Foundation. The government has certain rights in the invention.

FIELD OF THE DISCLOSURE

The present disclosure relates to threshold function identification processes for identifying a Boolean function as either a threshold function that can be implemented by threshold logic or a non-threshold function that cannot be implemented by threshold logic and processes for synthesizing threshold logic circuits, or networks, based thereon.

BACKGROUND

Threshold logic (TL) has long been known as an alternative way to compute Boolean functions. Much of the earlier work on TL dates back to the 1960s, which focused primarily on exploring the theoretical aspects of TL, with little attention being paid to the synthesis and optimization of large, multi-level TL circuits, which are also referred to herein as TL networks. The lack of efficient implementations of TL gates, when compared to static fully Complementary Metal Oxide Semiconductor (CMOS) transistor networks and the rapid development of synthesis and optimization tools for Boolean logic design, led to a loss of interest in developing a similar infrastructure for designing TL circuits. The situation is now changing in favor of threshold logic.

The scaling of Metal Oxide Semiconductor Field Effect Transistors (MOSFETs) that has been taking place for over three decades is expected to continue for at least another decade, after which a point will be reached where transitioning to non-CMOS technologies will be necessary. Research is currently in progress to find the best alternative to CMOS. A few examples of post-CMOS devices are resonant tunneling diodes (RTDs), single electron transistors (SETs), quantum cellular automata (QCA), and carbon nano-tube FETs (CNT-FETs). A common and important characteristic of these devices is that they can be used to realize TL efficiently. Efficient CMOS implementations of threshold gates are also currently available. Consequently, there has been a resurgence of interest in TL and synthesis and verification methods that are applicable to large, multi-level threshold circuits.

The traditional approach for the synthesis of multilevel threshold logic circuits is based on determining if a Boolean function is threshold by verifying satisfiability of a large number of integer linear inequalities. However, such an approach is only practical for functions with a few inputs. Thus, there is a need for a method for synthesizing multilevel threshold circuits that eliminates the use of integer linear programming (ILP) formulation to determine if a Boolean function is threshold and to evaluate the weights and threshold in case the function is a threshold function.

SUMMARY

The present disclosure relates to systems and methods for identifying a Boolean function as either a threshold function or a non-threshold function. A threshold function is one that can be implemented by threshold logic. A non-threshold function is one that cannot be implemented by threshold logic. In one embodiment, in order to identify a Boolean function as a threshold function or a non-threshold function, a determination is first made as to whether the Boolean function satisfies one or more predefined conditions for being a threshold function, where the one or more predefined conditions include a condition that both a positive cofactor and a negative cofactor of the Boolean function are threshold functions. In addition, the one or more predefined conditions may include: a condition that a support set of one cofactor contains a support set of the other cofactor, a condition that one cofactor contains the other cofactor (i.e., cofactor containment), and/or a condition that weights of the cofactors have a consistent wavy ordering. If the one or more predefined conditions are satisfied, a determination is made as to whether weights for the positive and negative cofactors are equal. The weights for the positive cofactor are weights that together with a threshold value for the positive cofactor define a threshold function that corresponds to the positive cofactor. Likewise, the weights for the negative cofactor are weights that together with a threshold value for the negative cofactor define a threshold function that corresponds to the negative cofactor. If the weights of the cofactors are equal, then the Boolean function is determined to be a threshold function.

Further, in one embodiment, if the weights of the cofactors are not equal, then a process is performed to try to equalize the weights of the cofactors. If the process successfully equalizes the weights of the cofactors, then the Boolean function is identified as a threshold function. Otherwise, the Boolean function is identified as a non-threshold function.

The present disclosure also relates to systems and methods that synthesize multilevel threshold circuits that implement a desired Boolean function without using integer linear programming (ILP) to determine if the Boolean function is threshold. An embodiment of the present disclosure receives a Boolean function as an input and outputs a network of threshold elements to synthesize an optimized threshold logic circuit that corresponds with the inputted Boolean function. In particular, the embodiment receives a Boolean function and converts the Boolean function into a novel cofactor tree data structure that represents the Boolean function. The cofactor tree data structure includes parent nodes, child nodes, leaf nodes, and a root node. This representation is a generic abstraction of cofactoring and includes many popular graphical representations of cofactoring like the Boolean Decision Diagram (BDD) and its variants. In this disclosure a novel graphical representation is introduced (called the min-max literal factor tree or max literal factor tree) and may be used to represent the Boolean function. However this does not limit the scope of the present disclosure, and the same technique proposed here can be applied to any cofactoring representation with or without changes to the procedure discussed herein. The leaf nodes may be, but are not required to be, a zero or one node. All leaf nodes of the cofactor tree data structure are threshold functions.

According to Shannon's Decomposition theory, the inputted Boolean function can be cofactored into positive and negative cofactors that constitute the inputted Boolean function. These positive and negative cofactors are Boolean sub functions that can also be cofactored into positive and negative cofactors that make up the nodes of the cofactor tree data structure. Cofactors making up the cofactor tree data structure are tested to determine whether or not they are threshold functions. Each node in the cofactor tree data structure is checked if its function can be implemented in a single threshold gate. This can be done when both the function cofactors are known to be threshold. An efficient way of accomplishing this includes (but is not limited to) recursively processing each node or considering each node in the bottom up fashion. If a tested cofactor is a threshold function, the process is repeated on its parent node. However, if the tested cofactor is not a threshold function, the cofactor tree and, specifically, a portion of the cofactor tree formed by the tested cofactor and its children nodes is restructured such that the tested cofactor is replaced with one that is a threshold function.

A process of repeated threshold function testing with cofactor tree restructuring as needed and threshold circuit synthesis continues on the nodes of the cofactor tree data structure until the root node of the cofactor tree data structure is eventually processed. The threshold gates outputted by this process and the interconnections among them (which together make up the threshold circuit that implements the inputted Boolean circuit) constitute the final output.

Those skilled in the art will appreciate the scope of the present disclosure and realize additional aspects thereof after reading the following detailed description in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 15 depicts pseudo code for an ISTHRESHOLD procedure, or function, implementing the threshold function identification process according to one embodiment of the present disclosure.

FIG. 16 depicts pseudo code for a TRYEQUALIZEWEIGHTS procedure, or function, called by the ISTHRESHOLD procedure of FIG. 15 according to one embodiment of the present disclosure.

FIG. 17 depicts pseudo code for a GETVALIDTHRESHOLD procedure, or function, called by the TRYEQUALIZEWEIGHTS procedure of FIG. 16 according to one embodiment of the present disclosure.

FIG. 18 depicts pseudo code for a RESYNTHESIZEWEIGHTS procedure, or function, called by the TRYEQUALIZEWEIGHTS procedure of FIG. 16 according to one embodiment of the present disclosure.

DETAILED DESCRIPTION

The embodiments set forth below represent the necessary information to enable those skilled in the art to practice the invention and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Before delving into the details of the present disclosure, some definitions of terms are provided to aid in understanding of the following disclosure. A threshold gate has one or more binary inputs, $x_1, x_2, \ldots, x_n$, and a single binary output. The gate is characterized by a set of weights, $W=w_1, w_2, \ldots w_n$, where $w_i$ is the weight associated with input $x_i$, and a threshold T. The output of a threshold gate is defined as follows:

$$y = \begin{cases} 1 \text{ if } \sum x_i w_i \geq T \\ 0 \text{ Otherwise} \end{cases} \qquad \text{Eq. 1}$$

A Boolean function is called a threshold function if it can be implemented by a single threshold gate. Since the threshold gate realizing a function f is completely characterized by the set of weights W and the threshold T, the threshold gate is represented by $f=[W; T]=[w_1, w_2, \ldots, w_n; T]$.

Figures 1, 2:
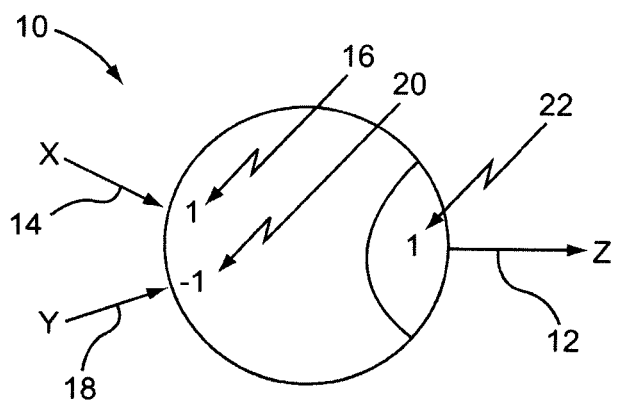
FIG. 1 is a diagram of an example threshold logic gate.
FIG. 2 is a truth table that shows the weighted sums and values of outputs for different combinations of inputs.

FIG. 1 shows an example of a threshold gate 10 having an output 12 that is governed by a function Z=XY'≡[X=1, Y=−1; T=1]. An input 14 for a variable X has an applied weight 16, which in this case is a one. Another input 18 for a variable Y has an applied weight 20, which in this example is a negative one. A threshold 22, which in this case has a value of one is tested against the weighted values of the variables X and Y. FIG. 2 is a truth table that shows the weighted sums and values of Z for the output 12 for combinations of X and Y inputs.

Threshold functions are a subset of unate functions. Since simple primitive gates such as OR, AND, NOR, and NAND are threshold, one can view a multi-level logic network composed of such gates as a special case of a threshold circuit. However, the advantage of using threshold logic is that much more complex functions can be implemented in a single threshold gate. Hence a multi-level threshold network may be viewed as a generalization of a traditional Boolean logic circuit using much more complex primitives. Such a generalization can lead to significant reduction in gate count and, in many cases, circuit depth. Moreover, significant reductions in gate count and circuit depth translates into significant reductions in required circuit area, circuit power consumption, and circuit signal delays. For example, a function such as ab(c+d)+cd(a+b) can be implemented by a single threshold gate. Traditionally, five Boolean AND/OR gates in three levels would be needed to implement the function ab(c+d)+cd(a+b). Since not all Boolean functions are threshold, an arbitrary Boolean function needs to be implemented as a multi-level threshold network.

Determining whether or not a given Boolean function is threshold is an important problem to solve for synthesis, verification, and optimization of threshold logic networks. Another important problem to solve is to decompose a Boolean function into sub-functions that are threshold, i.e. to determine the parts of the Boolean function that are threshold. After a function has been identified as threshold, it is necessary to assign weights and a threshold for the gate. Currently, the task of identifying threshold functions and assigning weights is done using an Integer Linear Programming (ILP) formulation.

An embodiment of the present disclosure is an efficient (i.e., non-ILP) method that addresses the above problems. The disclosed method generally involves identifying functions or sub-functions that are threshold, and assigning weights and thresholds. Only recently has there been a significant effort in the area of threshold synthesis. Most of these prior art methods use the ILP formulation to determine whether or not a function is a threshold function and weight-threshold assignment. Moreover, most prior art methods use a pre-synthesized Boolean circuit and local merging of Boolean gates to obtain a threshold circuit. Thus the quality of result depends on the circuit representation used as an input.

Figure 3:
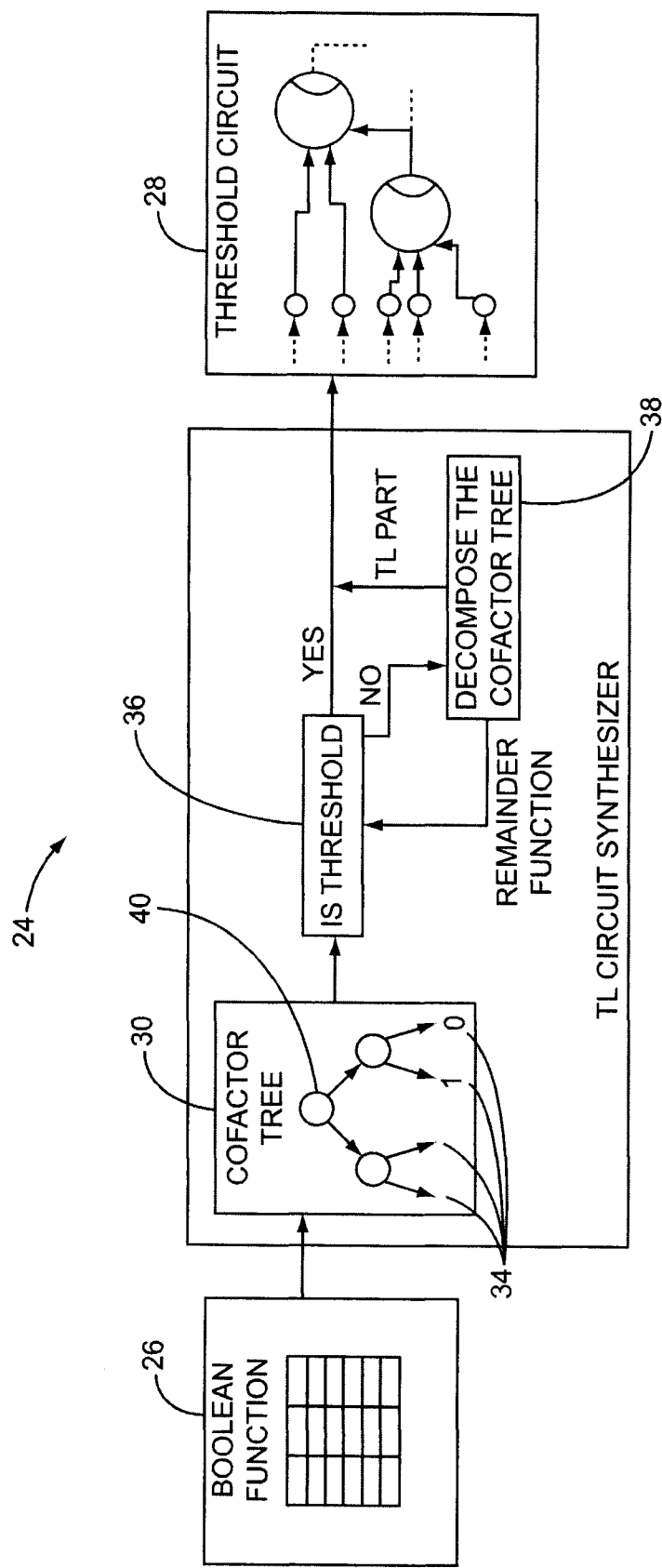
FIG. 3 depicts a high-level generalization of a threshold logic (TL) circuit synthesizer that incorporates a decomposition based approach for the synthesis of threshold logic circuits according to an embodiment of the present disclosure.

FIG. 3 depicts a high-level generalization of a decomposition based approach for the synthesis of threshold logic circuits according to an embodiment of the present disclosure. As shown in FIG. 3, a threshold logic (TL) circuit synthesizer 24 converts a Boolean function 26 into a network of threshold elements that can be implemented as a threshold circuit 28 using various physical implementations (such as Resonant Tunneling Diodes (RTDs), Single Electron Transistors (SETs), Carbon nano-tube Field Effect Transistors (FETs), etc.).

The TL circuit synthesizer 24 initially receives and cofactors the Boolean function 26 into a cofactor tree data structure 30 which is a data structure that includes leaf nodes 34. The leaf nodes 34 can be Boolean AND, Boolean OR, or a single literal or a constant one or zero if the factor tree is a Min-Max Literal Factor Tree. Again, note that a Min-Max Literal Factor Tree is also referred to herein as a Max Literal Factor Tree (i.e., Min-Max Literal Factor Tree and Max Literal Factor Tree are used interchangeably herein). The leaf nodes are constant one and zero nodes in case of a Boolean Decision Diagram (BDD). The representation can be changed and the method will work for all representations of function cofactoring. The TL circuit synthesizer 24 accepts the Boolean function 26 as input in various forms such as a truth table and factored form, etc. The various input forms are all inter-convertible by way of public domain and commercial tools such as, but not limited to, the Berkeley-SIS tool and the Synopsis Design Compiler®.

The cofactor tree data structure 30 is generated by cofactoring the Boolean function 26 into constituent positive and negative cofactors. The cofactor tree data structure 30 completely specifies the Boolean function 26 in accordance with the Shannon Decomposition Method, which states that $F=x \cdot F_x + x' \cdot F_{x'}$. In this way, the Boolean function 26 represented by F is defined by the positive cofactor $F_x$ and the negative cofactor $F_{x'}$. Cofactoring continues to yield constituent positive and negative cofactors for each positive and the negative cofactor. Cofactoring is repeated until a leaf node is encountered within the cofactor data tree structure 30. This leaf node is dependent on a cofactor tree representation chosen.

A threshold determining function 36 determines if the Boolean function 26 is threshold when the cofactors $F_x$ and $F_{x'}$ of the Boolean function 26 are known to be threshold. Since cofactors of the leaf nodes 34 are always threshold, all the leaf nodes 34 of the cofactor tree data structure 30 are threshold. In this way, the threshold determining function 36 can determine if the function of any node in the cofactor tree data structure 30 is threshold, when its cofactors are known to be threshold.

If the threshold determining function 36 determines that a cofactor of the Boolean function 26 is threshold, the process continues with its parent node. In contrast, if a cofactor of the Boolean function 26 is determined to be non-threshold, the cofactor is sent to a decomposition function 38. The threshold cofactor (i.e., the TL part), either the $F_x$ cofactor or the $F_{x'}$, is sent to be added as part of threshold circuit 28. The remainder function (i.e., the one remaining after either cofactor is removed) is sent to the threshold determining function 36 again. All cofactors associated with nodes of the cofactor tree data structure 30 are processed in the same manner until a root node 40 of the cofactor tree data structure 30 is eventually processed.

Figure 4:
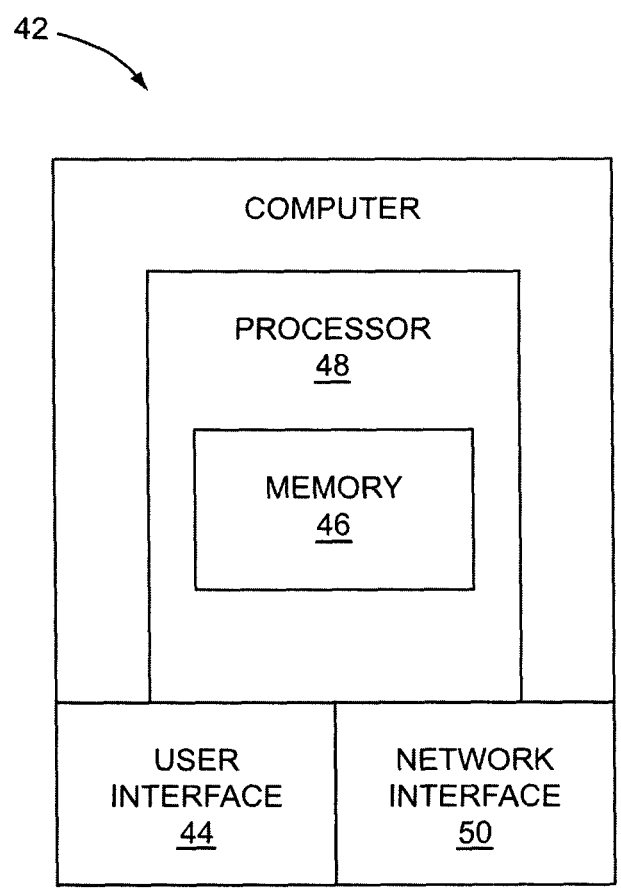
FIG. 4 is a block diagram of a computer system for executing the TL circuit synthesizer.

FIG. 4 is a block diagram of a computer system 42 for executing the TL circuit synthesizer 24 (FIG. 3). The computer system 42 includes a user interface 44 for receiving the Boolean function 26 (FIG. 3) and for displaying or printing the synthesized threshold circuit 28 (FIG. 3). A memory 46 is for storing the cofactor tree data structure 30 (FIG. 3) along with software code comprising the TL circuit synthesizer 24. A processor 48 is for executing the software code comprising the TL circuit synthesizer 24. An optional network interface 50 is useable to transmit data such as the synthesized threshold circuit 28 and the Boolean function 26 over a network such as the Internet.

In order to disclose further details of the present disclosure, additional definitions are provided. A positive threshold function is one in which all the variable weights in a weight-threshold assignment are positive. A positive threshold function is also a positive unate function. For example F=a+bc≡ [w(a)=2, w(b)=1, w(c)=1; T=2] is a positive threshold function. Note that F=a+bc≡[w(a)=2, w(b)=1, w(c)=1; T=2] is also a positive unate function.

Support Set: The set of all variables on which a function depends is called the support set of the function. The support set of function F is denoted by Supp(F) or $S_F$. For example, F=a+c, Supp(F)={a, c}.

Cofactors: As discussed above, if F is a Boolean function then the positive (Shannon) cofactor of F with respect to a variable a, denoted by $F_a$, is the Boolean function obtained by evaluating F with a=1. The negative cofactor of F, denoted by $F_{a'}$, is similarly defined. Note that $S_F$ can also be defined as {a|Fa=Fa'}.

Don't Dare Variable: A variable d is said to be a "don't care" variable of a function F if and only if F(d=0)=F(d=1). Don't care variables do not belong to the support set of a function.

Sum of Products (SOP): A SOP formula is a complete sum (i.e., a sum of all prime implicants and only prime implicants) if and only if:
1) no term includes any other term; and
2) the consensus of any two terms of the formula either does not exist or is contained in some other term.

Max Literal: Let F be a Boolean function, given in the form of a SOP in which no cube is contained in another (i.e., it is minimal with respect to single cube containment). The max literal of a function F is the literal that occurs most frequently among the largest cubes in F. In the case of a tie, then the tie among those literals is broken by comparing their frequency among the next smaller size cubes. Example: Consider the function F=ab+be+cde. The largest cubes are {ab, bc}, and since b occurs most frequently, b is the max literal of F. As another example, consider F=abc+ad+ae+de. The literals a, d, and e each occur twice among the largest cubes {ad, ae, de}. Among (a, d, e), a occurs most often in the next largest cubes, namely, abc. Hence a is the max literal.

Complete Sum: The complete sum of function F is denoted by CS(F). For example, the complete sum of ab'+ab+c is CS(F)=a+c.

Ordering: For a function F, if $F_{x=1,y=0} \supset F_{x=0,y=1}$ (also denoted $F_{xy'} \supset F_{x'y}$), then x is wavily greater than or equal to y, and is denoted as $x \succeq y$. $x \preceq y$ is defined similarly. If $F_{x=1,y=0} \supset F_{x=0,y=1}$, then x is strictly wavily greater than y and is denoted as $x \succ y$. $x \prec y$ is defined similarly. For a pair of variables x and y, if $x \succeq y$ and $x \preceq y$, then x is wavily equal to y and is denoted as x≈y. Example: Consider the function F=x+yuv. Since Fxy'=1 and Fx'y=uv, Fxy' ⊃ Fx'y, and $x \succ y$. An equivalent characterization of wavy ordering is that if $x \succ y$ then the number of minterms in which x=1 is greater than the number of minterms in which y=1. For a threshold function, $w_x > w_y$ implies $x \succeq y$, and $w_x = w_y$ implies x≈y. It is also known that for a threshold function F, Supp(F) can be totally pseudo-ordered using the $\succeq$-relation.

Factorization of a Boolean function represented in SOP form is done to reduce the number of literals and thereby obtain more compact representations. For the purposes of this disclosure, an SOP is a set of cubes, wherein a cube is the AND of a set of literals.

Algebraic factorization is the algebraic division of a Boolean function. If D is the divisor used to factor function F, then F=Q·D+R, where Q and R are the quotient and remainder obtained by the algebraic division of F by D. Q and R may be further factored to obtain a more compact factored form. Many different factoring techniques have been developed. The main difference between these different techniques is the way in which the divisors are chosen. One factoring technique called the best literal factorization uses a literal for the divisor that occurs in the greatest number of cubes. For example, for F=ab+ac+de=a(b+c)+de, a is the best literal as it occurs in two cubes, which is more than the number of cubes in which any other literal occurs. Here Q=b+c, D=a, R=de, and F=Q·D+R.

Figure 5:
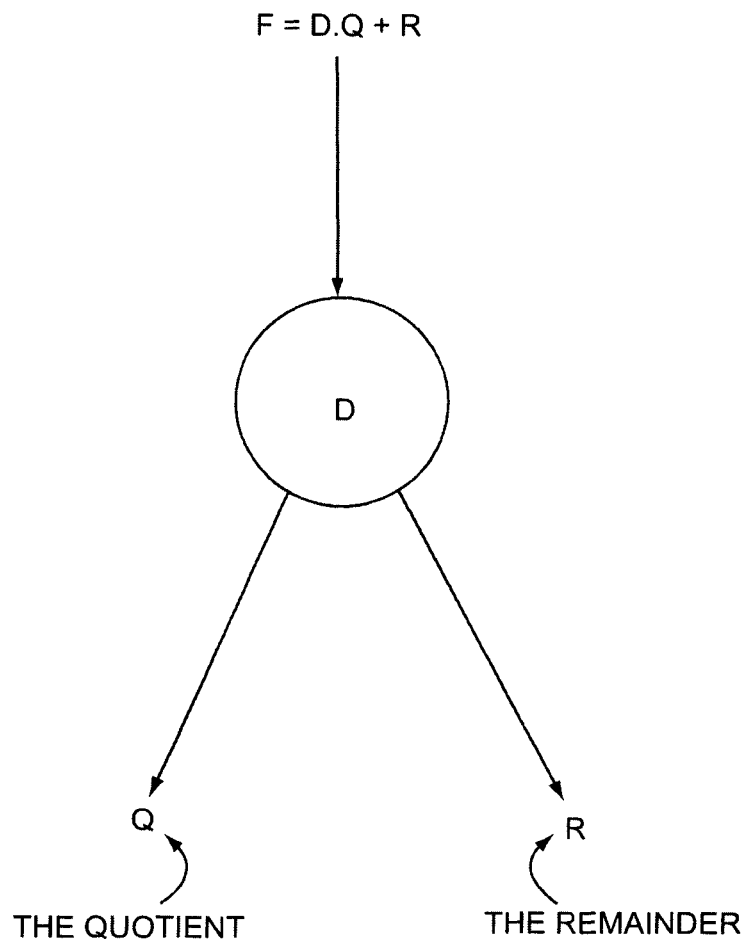
FIG. 5 is a diagram of a Min-Max Literal (MML) factor tree structure according to the present disclosure.

FIG. 5 is a diagram illustrating a novel factorization method according to the present disclosure. The factorization represented in FIG. 5 is referred to herein as the MML factorization or Max Literal Factorization and is well suited for the factorization implemented by the TL circuit synthesizer 24 (FIG. 3). As shown in FIG. 5, the left edge of a node is labeled using the MML chosen to be the divisor of the function of the node. A left child node represents the quotient obtained by algebraic division and a right child node represents the remainder.

MML factorization is very similar to the best literal factorization in that a single literal is used as a divisor, but MML factorization has novelty in the technique used to choose the divisor D. For instance, let $C_j$ represent the set of all cubes in an SOP that contain j literals. The MML is a literal that occurs in the greatest number of cubes in $C_k$, where k is the size of the smallest cube. For example, in ab+ce+ad+bcd, a is the MML as it occurs more often in $C_2$={ab, ce, ad}, than any other literal. In case of a tie, the literals that occur in an equal number of cubes in $C_k$ are then compared to each other using the occurrences of these literals in $C_{k+1}$ and so on, until the tie is resolved. For example, in abc+ad+ae+de, again a is the MML. Even though a, d, and e all occur in two cubes in $C_2$={ad, ae, de}, the tie is broken using $C_3$={abc}, since a occurs in one cube of $C_3$, whereas d and e are not present in any cube in $C_3$. In case the tie is not broken even after comparing the variable occurrences in $C_1$, where 1 is the size of the largest cube, the tie is broken arbitrarily. In ab+ac+bc, a, b, or c can be chosen as the MML as they all occur in an equal number of cubes in $C_2$ and the largest cube size is two.

Figure 6:
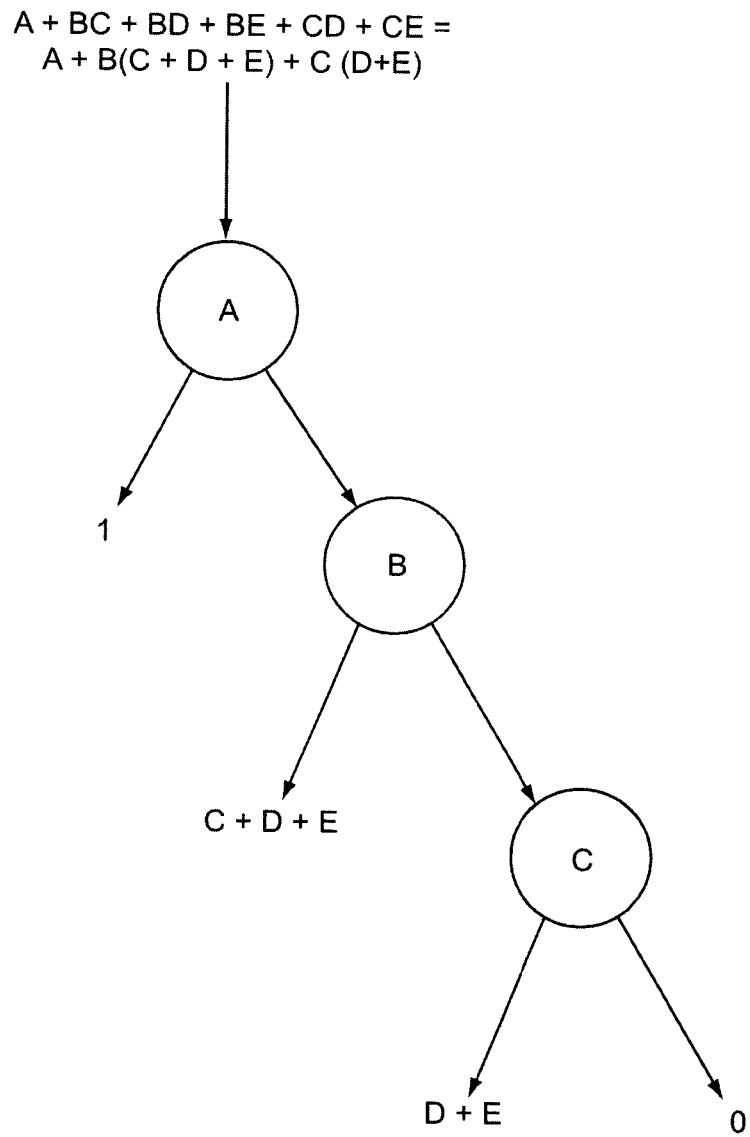
FIG. 6 is a diagram of an example MML factor tree for a given Boolean function.

After repeatedly factoring an SOP using the MML factorization, the factored form may be represented using a factor tree such as cofactor tree data structure 30 (FIG. 3). FIG. 6 depicts an example of a MML factor tree for a function G=a+bc+bd+be+cd+ce=a+b(c+d+e)+c(d+e).

Turning back to FIG. 3, the parts of the Boolean function 26 that are threshold are determined by the threshold determining function 36. An MML factor tree, such as the cofactor tree data structure 30, is constructed from the Boolean function 26, which can be in an SOP form. To make the factor tree more compact, the SOP form of the Boolean function 26 is minimal with respect to single cube containment. Although MML factorization is not necessary to obtain the cofactor tree data structure 30, it has some convenient features. For a threshold function, the MML represents the variable with the highest weight. All literals of the SOP form are assumed to be positive without loss of generality. Therefore a and a' are considered to be two separate literals. All weights that are assigned during the decomposition procedure are thus positive. The exact weights can be easily obtained by the use of Lemma 6 (Appendix I). For example, if the decomposition procedure yields the following weight-threshold assignment: [w(a')=2, w(b)=1, w(c)=1; T=3], then by Lemma 6 (Appendix I), this is equivalent to [w(a)=−2, w(b)=1, w(c)=1; T=1]. It is important to note that the cofactor tree data structure 30 is a general abstraction for concrete data structures used by existing circuit synthesis tools. A BDD (one manifestation of the cofactor tree data structure 30) is one of the most popular graphical representations of cofactoring used by existing circuit synthesis and analysis tools. In a preferred embodiment, the disclosed MML factor tree has many convenient features when implemented as the cofactor tree data structure 30.

Figure 7:
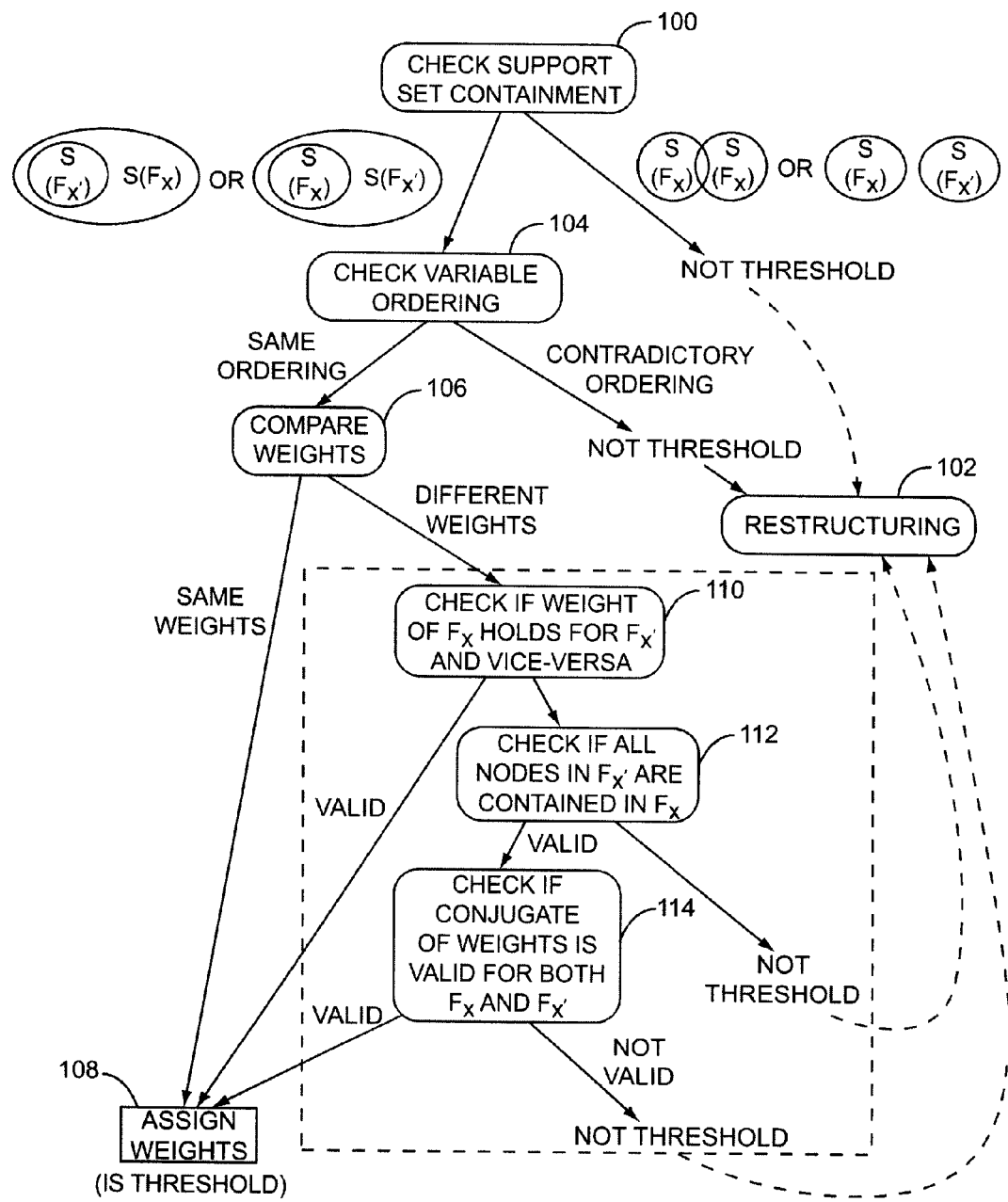
FIG. 7 depicts the steps involved in threshold function identification.

FIG. 7 shows a more detailed operations flow for the TL circuit synthesizer 24 (FIG. 3). The TL circuit synthesizer 24 traverses the cofactor tree data structure 30 (FIG. 3) in a bottom-up fashion (this can also be achieved by a recursive implementation). In this example the cofactor tree data structure 30 is of the preferred MML type. By construction, the leaf nodes, which are AND/OR functions or constants one or zero of the cofactor tree data structure 30, are threshold. The threshold determining function 36 (FIG. 3) determines whether or not a node of the cofactor tree data structure 30 is a threshold function given that its two child nodes are threshold functions. If so, the weights for the threshold functions are determined; otherwise, the Boolean function 26 (FIG. 3) is transformed by reorganizing the cofactor tree data structure 30 after decomposing one cofactor of the function (of a node in the cofactor tree data structure 30 that is not threshold) of the Boolean function 26.

In the following example, let $F_x$ and $F_{x'}$ be the left and right children of a node F, with x being the cofactor literal (i.e., $F=xF_x+x'F_{x'}$ in case of a positive threshold function $F=xF_x+F_{x'}$. Suppose $F_x$ and $F_{x'}$ are threshold functions. Lemma 5 (Appendix I) states that F is not a threshold function if, in a cofactor tree, the support set of one child is not contained in the support set of the other child. Therefore, the threshold determining function 36 checks for support set containment (step 100). If F is determined not to be threshold, F is restructured (step 102).

Next, if the conditions of Lemma 5 (Appendix I) are satisfied, the conditions of Lemma 4 (Appendix I) are checked (step 104), which state that in a cofactor tree, if there exists a pair of variables in $F_x$ and $F_{x'}$ that have different $\succeq$-ordering, then F is not a threshold function and F is restructured (step 102). However, if the ordering is found not to be contradictory, the variable weights of $F_x$ and $F_{x'}$ are compared to test the weights for equivalence (step 106). If the weights are the same, then F will be a threshold function (Lemma 1, Appendix I) and weights are assigned (step 108) to the leaf nodes of F (also indicated in Lemma 1, Appendix I). In contrast, if the weights are not the same, F may or may not be a threshold function. Therefore an Extended Identification (EX-I) procedure shown in the dashed box of FIG. 7 is implemented to determine whether or not F is a threshold function.

If the weights are not the same, the EX-I procedure checks to determine if the weight of $F_x$ holds (i.e., is valid) for $F_{x'}$ and vice versa (step 110). If so, F is a threshold function and weights are assigned to the corresponding node in the cofactor tree data structure 30 (step 108). However, if the weight of $F_x$ does not hold for $F_{x'}$ and vice versa, a check is conducted to see if all the nodes in $F_{x'}$ are contained in $F_x$ (if all the nodes in $F_x$ are contained in $F_{x'}$) (step 112). If all the nodes $F_{x'}$ are not contained $F_x$ (and vice versa), then F is not threshold and F is restructured (step 102). Otherwise, the conjugate of the weights (which is obtained by adding the individual weights) is checked for validity with regard to both $F_x$ and $F_{x'}$ (step 114). If the conjugate of the weights is valid for both $F_x$ and $F_{x'}$, then F is threshold and weights are assigned to the node corresponding to F (step 108). Otherwise, F is not threshold and F is restructured (step 102).

Figure 8A:
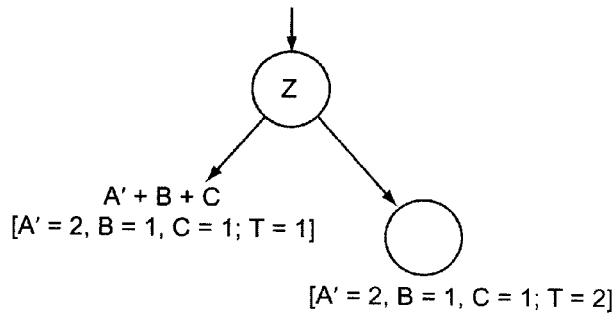
FIG. 8A shows the weight assignments for an OR node.
Figure 8B:
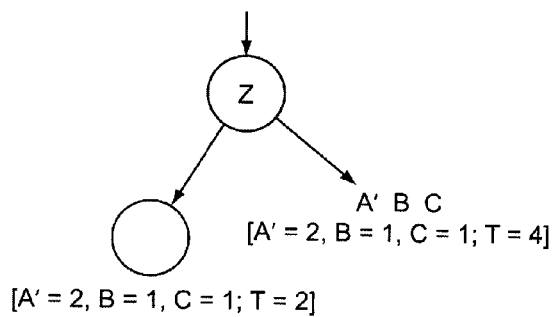
FIG. 8B shows the weight assignments for an AND node.
Figure 8C:
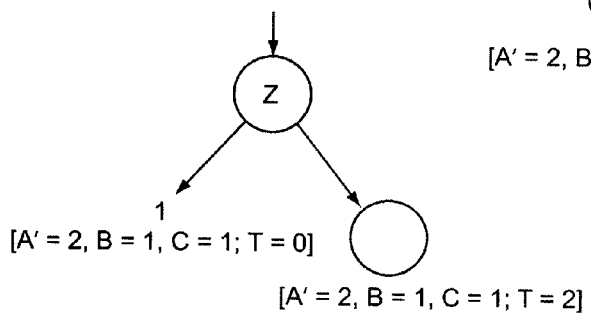
FIG. 8C shows the weight assignments for a constant one node.
Figure 8D:
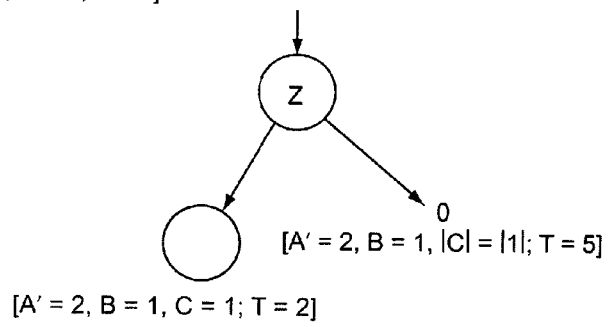
FIG. 8D shows the weight assignments for a constant zero node.

In order to increase the chance of identifying threshold functions, the following rules are used to assign weights to the leaf nodes. Note that all literals are treated as positive literals:

1. The AND, OR, and constants one and zero nodes are assigned the same weights as the weights assigned to a sister node function. Two nodes are sister nodes if and only if they have the same parent.
2. For an OR node, the exact same weights of the sister node are assigned and the threshold is set to be equal to the smallest variable weight. This is a valid weight-threshold assignment for conditions when any of the inputs are a one. FIG. 8A shows the weight assignments for an OR node.
3. For an AND node, the exact same weights of the sister node are assigned and the threshold is set to be the sum of all weights. The AND function outputs a one only when all of the AND function's inputs are one. FIG. 8B shows the weight assignments for an AND node.
4. The weights are similarly made identical to that of the sister node in case of a constant one node. The threshold is set to zero since all weights are >0 (positive threshold function) and no matter what the state of input variables are, the weighted sum of inputs is always≥0, which is the threshold. FIG. 8C shows the weight assignments for a constant one node.
5. The threshold is set to be one greater than the sum of all weights for a constant zero node after setting the same weights as that of the sister node. FIG. 8D shows the weight assignments for a constant zero node.
6. If the leaf node is AND/OR and the sister node has not been assigned weights and a threshold, a weight of one is assigned to all inputs. The threshold is set to be one for an OR node and it is set to be the cardinality of the support set in case of an AND node.

Figure 9:
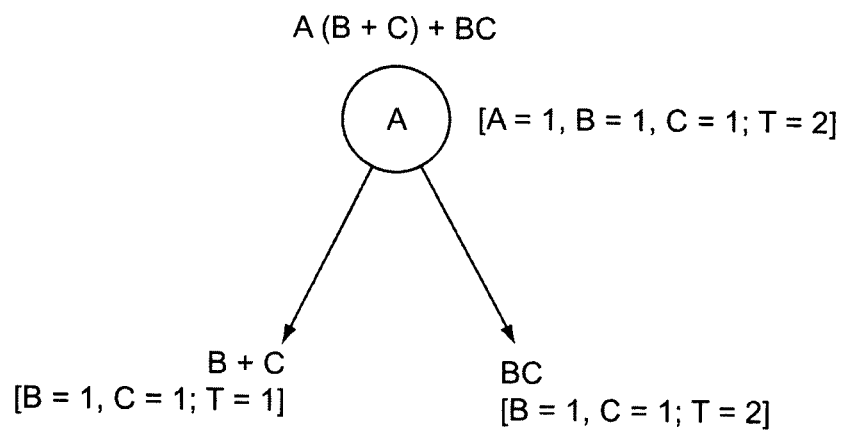
FIG. 9 shows a MML factor tree of a function having leaf nodes that are trivial threshold functions.

FIG. 9 shows an example MML factor tree for the function A(B+C)+BC. The leaf nodes are trivial threshold functions whose weight-threshold pairs can be trivially assigned. Now consider the parent node. Both children satisfy Lemmas 5 and 4 (Appendix I), and have the same weights. Hence weight-threshold assignment for the parent node can be determined by Lemma 1 (Appendix I).

The restructuring of the factor tree is done when the node F is declared to be a non-threshold function, even though its children are threshold. When a node is not threshold but the children of the node are threshold, the MML factor tree is decomposed. The larger of the two child nodes (the one with the bigger support set) is removed (any other criteria can be used for selecting the child to decompose), and the MML factor tree is modified so that more threshold functions may be identified.

Figure 10:
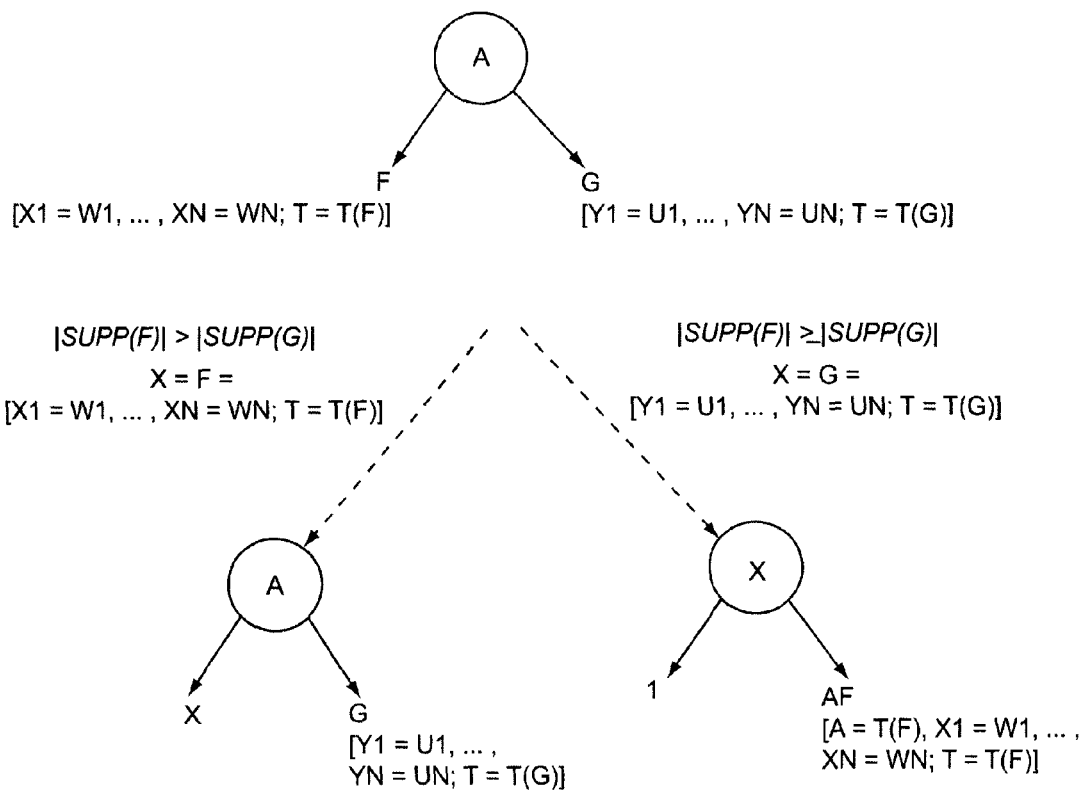
FIG. 10 illustrates two different restructuring rules that depend on child node elimination.

FIG. 10 illustrates that there are two different restructuring rules depending on which child node is eliminated. Similar rules are used if a BDD is used as the cofactor tree representation. However, in the rest of the discussion only the MML factor tree representation is considered. The function of the child node with a larger support set is assigned a single literal, in this case X, and the tree is reordered. Reordering is straightforward if the left child node is replaced by a literal. Reordering is more involved if the right child node is replaced by a literal. Note that this reordering does not change the function represented by the tree. The procedure only helps to identify sub trees in the MML factor tree that represent threshold functions.

Figure 11A:
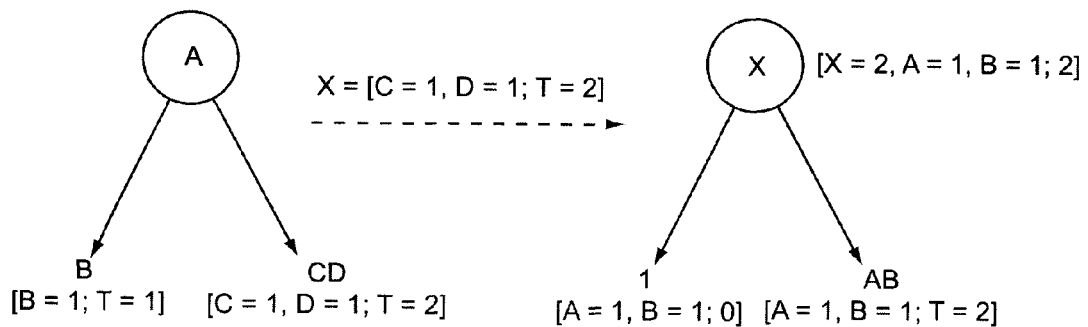
FIG. 11A depicts nodes for a function that is a not a threshold function.
Figure 11B:
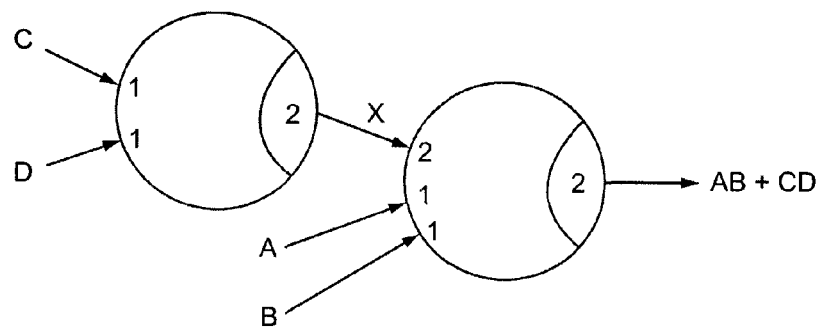
FIG. 11B depicts a threshold circuit synthesized by repeatedly applying the present decomposition method to the function represented in FIG. 11A.

A threshold circuit is a directed graph. The nodes in the graph of FIG. 11B represent threshold elements, and the directed edges represent input-output interconnection between different gates. Each threshold element has a weight-threshold assignment that fully characterizes the element. The objective of the synthesis procedure is to generate a threshold circuit that implements the specified function.

The threshold identification methodology developed earlier is an integral part of the synthesis procedure. Note that the identification procedure identifies sub functions that are threshold. If repeated threshold identification coupled with decomposition of the cofactor tree is performed until the root node is declared to be threshold, the result is a network of threshold gates that will implement the required function. For example, consider the function AB+CD. As depicted in FIG. 11A, the function AB+CD is a not a threshold function. However, by using the decomposition methodology repeatedly we can obtain the threshold circuit shown in FIG. 11B.

Figure 12:
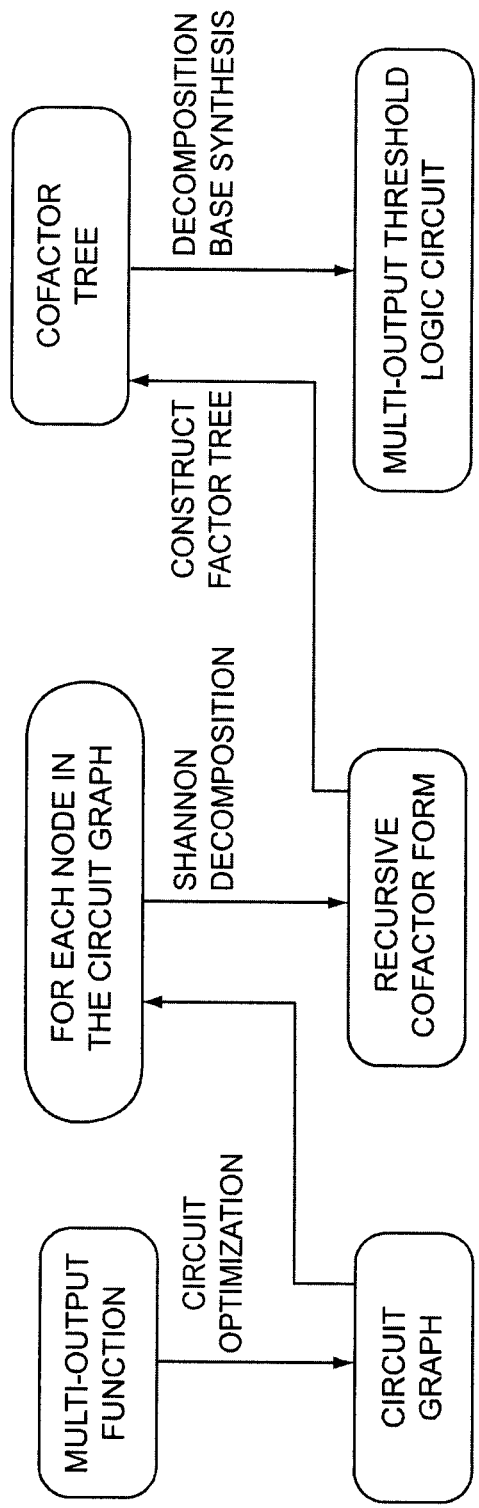
FIG. 12 depicts a threshold circuit synthesis flow.

FIG. 12 illustrates a version of the synthesis flow that could be used to generate threshold circuits that implement multi-output functions. Any other variation of the same may be developed for particular implementations. In the implementation discussed here Berkeley-SIS is used to obtain an optimized circuit graph. Each node in the circuit graph represents a complex Boolean function. For each node, the cofactor tree of the node function is constructed. Decomposition based synthesis is performed to obtain a threshold circuit for the function of the node. Once a threshold circuit is obtained for all nodes in the circuit graph, the required multi-output threshold circuit has been generated.

In order to compare the circuit synthesizing results of the present embodiment with typical circuit synthesizing results with other approaches, circuits in the Microelectronics Center of North Carolina (MCNC) benchmark suite were synthesized using the algorithm described herein. The results are reported in Table 1 below. Gate count and depth are non-technology-specific metrics for area and delay. These are reported herein as they are reported in previously published work (R. Zhang, P. Gupta, L. Zhong, and N. K. Jha, "Threshold Network Synthesis and Optimization and Its Application to Nanotechnologies," IEEE Transactions on Computer Aided Design, 2005, which is incorporated herein by reference in its entirety). Thus, this approach is compared against a modern circuit synthesis method. Table 1 lists the gate count and level count for the benchmark circuits when implemented as Boolean circuits and as TL circuits by the method described by Zhang et al., which has a fanin restriction of six inputs. Compared to the method described by Zhang et al., the method of the present invention generates circuits with comparable depth and 27% fewer gates on average and 66% fewer gates at best. This method does not have a restriction on the fanin of gates; however, such a restriction can be imposed if needed.

TABLE 1

Comparison with previous state-of-art

| Bench-mark | Boolean Circuit | | Method proposed by Zhang et al. | | Proposed Method | |
|---|---|---|---|---|---|---|
| | Gates | Depth | Gates | Depth | Gates | Depth |
| b1 | 10 | 4 | 8 | 3 | 6 | 3 |
| cm42a | 13 | 3 | 13 | 3 | 12 | 3 |
| decod | 24 | 3 | 24 | 3 | 18 | 2 |
| cm82a | 18 | 5 | 12 | 4 | 12 | 6 |
| majority | 5 | 3 | 1 | 2 | 1 | 1 |
| parity | 45 | 9 | 45 | 9 | 30 | 8 |
| z4ml | 39 | 8 | 19 | 5 | 16 | 8 |
| f51m | 101 | 8 | 82 | 8 | 40 | 5 |
| 9symml | 141 | 10 | 110 | 9 | 82 | 9 |
| alu2 | 253 | 27 | 197 | 25 | 152 | 26 |
| x2 | 20 | 5 | 15 | 4 | 15 | 4 |
| cm152a | 13 | 4 | 11 | 4 | 8 | 4 |
| cm85a | 26 | 5 | 14 | 5 | 14 | 7 |
| cm151a | 14 | 6 | 12 | 5 | 17 | 5 |
| alu4 | 517 | 28 | 410 | 23 | 297 | 33 |
| cm162a | 39 | 7 | 26 | 8 | 18 | 7 |
| cu | 31 | 6 | 24 | 4 | 16 | 4 |
| cm163a | 40 | 6 | 25 | 6 | 17 | 6 |
| cmb | 33 | 7 | 27 | 6 | 14 | 3 |
| pm1 | 25 | 4 | 23 | 4 | 16 | 3 |
| tcon | 32 | 3 | 32 | 3 | 16 | 2 |
| pcle | 42 | 6 | 35 | 6 | 26 | 9 |

TABLE 1-continued

Comparison with previous state-of-art

| Bench-mark | Boolean Circuit | | Method proposed by Zhang et al. | | Proposed Method | |
|---|---|---|---|---|---|---|
| | Gates | Depth | Gates | Depth | Gates | Depth |
| sct | 54 | 6 | 38 | 5 | 33 | 4 |
| cc | 49 | 6 | 35 | 6 | 23 | 3 |
| cm150a | 25 | 5 | 21 | 4 | 32 | 6 |
| cordic | 61 | 9 | 49 | 7 | 52 | 6 |
| ttt2 | 127 | 7 | 100 | 6 | 84 | 6 |
| pcler8 | 50 | 7 | 47 | 7 | 34 | 9 |
| frg1 | 97 | 12 | 59 | 9 | 24 | 6 |
| c8 | 109 | 8 | 85 | 7 | 75 | 6 |
| comp | 89 | 9 | 83 | 8 | 57 | 13 |
| my adder | 160 | 34 | 96 | 18 | 33 | 17 |
| term1 | 278 | 11 | 226 | 10 | 102 | 8 |
| count | 91 | 12 | 79 | 12 | 48 | 18 |
| unreg | 66 | 4 | 50 | 5 | 48 | 3 |
| cht | 119 | 5 | 82 | 5 | 73 | 3 |
| apex7 | 171 | 10 | 118 | 9 | 94 | 9 |
| x1 | 293 | 8 | 203 | 7 | 82 | 6 |
| example2 | 226 | 9 | 182 | 8 | 137 | 8 |
| x4 | 264 | 7 | 189 | 8 | 159 | 5 |
| apex6 | 543 | 12 | 396 | 12 | 310 | 12 |
| x3 | 660 | 9 | 441 | 7 | 415 | 8 |
| pair | 1199 | 14 | 907 | 12 | 609 | 15 |

The most important advantage of the presently disclosed method when compared with these two previous approaches is that it gives a combinatorial method and a theoretical underpinning for synthesizing TL circuits as opposed to the heuristic of localized merging of Boolean gates.

The method in M. Avedillo and J. Quintana, "A Threshold Logic Synthesis Tool for RTD Circuits," Euromicro Symposium on Digital System Design, 2004, generates feed forward TL networks in which there is only one gate in each level. This method is extremely expensive in terms of computation time. It requires more than a minute even for small circuits of only two TL gates. In comparison, the method of the present disclosure takes an average of two seconds to complete execution. Even for circuits that have over six hundred threshold gates it takes no more than six seconds to generate the threshold circuit.

Figure 13:
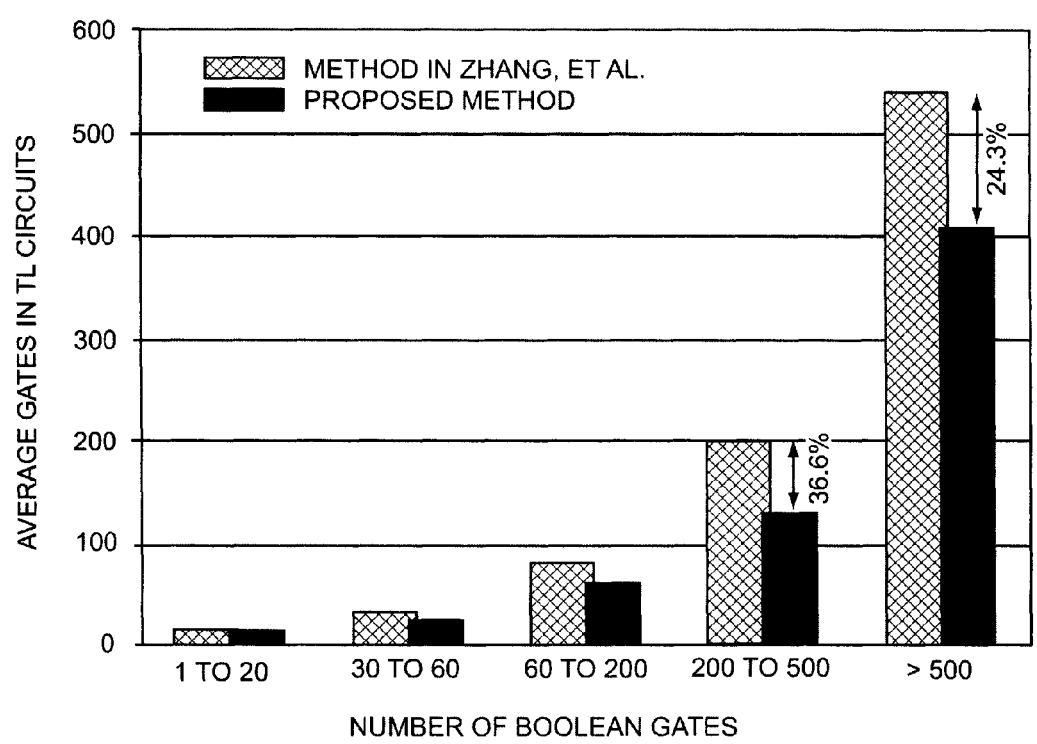
FIG. 13 is a bar graph showing a comparison of an average number of gates in TL circuits versus the number of Boolean gates with regard to the present decomposition and synthesis method and a reference synthesis method.

To better compare the results, a histogram may be used, as shown in FIG. 13. The horizontal x-axis of the histogram represents the number of gates in the Boolean circuit. The vertical y-axis of the histogram plots the average number of gates in the threshold circuits generated by the two methods to implement the same benchmarks. For example, consider the circuits that needed 200 to 500 gates in the Boolean implementation. Zhang et al.'s method requires an average of 200 gates, whereas the method of the present embodiment requires an average of only 126 gates to implement the same circuits. As shown in FIG. 13, the approach described herein needs fewer gates than the reference approach in every range. The improvement in the gate count is greater for larger circuits.

In terms of delay, the circuits generated by the method of the present disclosure are on average 1% worse than the circuits generated by the method proposed by Zhang et al. The focus of this particular implementation of the invention was to reduce the gate count and in this regard the proposed method did better than the previous method for almost all circuits. The invention can be used with suitable changes to obtain different circuits that are better suited for improving different circuit parameters (like delay, power, etc.).

Figure 14:
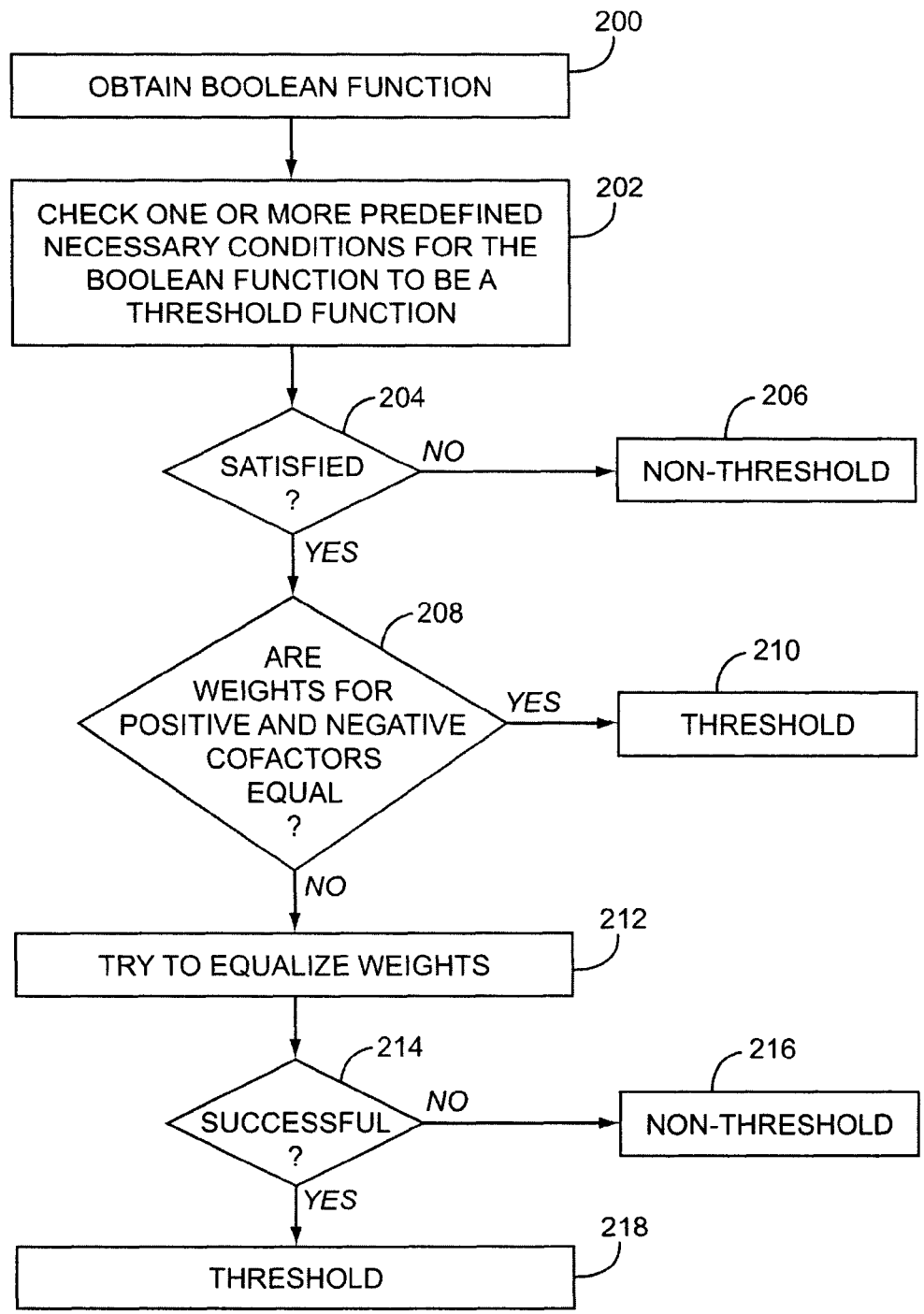
FIG. 14 is a flow chart illustrating a threshold function identification process according to another embodiment of the present disclosure.

FIG. 14 illustrates a threshold function identification process according to another embodiment of the present disclosure. This threshold identification process may be used in any suitable application in which threshold function identification is desired. As an example, this threshold function identification process may be utilized to determine whether a Boolean function and/or its sub-functions are threshold functions for purposes of synthesizing a corresponding threshold logic circuit, or network. As a specific example, this threshold function identification process may replace the threshold function identification component of the process described above with respect to FIG. 7. However, the present disclosure is not limited thereto.

The threshold function identification process starts by obtaining a Boolean function (step 200). Notably, the Boolean function may be any desired Boolean function or a sub-function of another Boolean function (e.g., a cofactor of another Boolean function). Next, the process checks one or more predefined necessary conditions for the Boolean function to be a threshold function (step 202). In this embodiment, the one or more necessary conditions include at least the condition that the positive and negative cofactors of the Boolean function are threshold functions. In addition, the one or more necessary conditions may include, but are not limited to, one or more of the following: a condition that a support set of one cofactor contains a support set of the other cofactor, a condition that one cofactor contains the other cofactor (i.e., there is cofactor containment), and a condition that the weights for threshold functions for the cofactors have consistent wavy ordering. Note however that these necessary conditions are exemplary. Other necessary conditions may additionally or alternatively be used.

The process determines whether the one or more necessary conditions checked in step 202 are satisfied (step 204). If not, the Boolean function is identified as being a non-threshold function (step 206). Otherwise, the process determines whether the weights for the positive and negative cofactors of the Boolean function are equal (step 208). More specifically, by the time the process has reached step 208, the process has already determined that the positive and negative cofactors of the Boolean function are threshold functions, which are defined by corresponding weights and threshold values. In step 208, the weights defined for the corresponding threshold functions for the positive and negative cofactors are compared to determine whether the weights for the positive cofactor are equal to the weights of the negative cofactor. If so, the Boolean function is identified as a threshold function (step 210).

If the weights of the positive and negative cofactors of the Boolean function are not equal, the process then tries to equalize the weights of the positive and negative cofactors (step 212). Any suitable technique for equalizing the weights of the positive and negative cofactors may be used. A number of exemplary techniques are discussed below. The process determines whether the weights of the positive and negative cofactors have been successfully equalized (step 214). If not, the Boolean function is identified as being a non-threshold function (step 216). If so, the Boolean function is identified as being a threshold function (step 218). Using this process, any number of Boolean functions and/or sub-functions of Boolean functions (e.g., cofactors) may be processed to identify whether the functions are threshold functions.

FIGS. 15 through 18 depict pseudo-code for a number of exemplary procedures, or functions, that implement the threshold function identification process of FIG. 14 according to one embodiment of the present disclosure. Note that these procedures and the pseudo-code for these procedures are exemplary and are not intended to limit the scope of the present disclosure. Numerous variations are possible and will be apparent to one of skill in the art upon reading this disclosure. Such variations are considered to be within the scope of the present disclosure.

FIG. 15 depicts pseudo-code for an ISTHRESHOLD procedure that implements the threshold function identification process of FIG. 14 according to one embodiment of the present disclosure. In general, the ISTHRESHOLD procedure determines whether a given Boolean function F is a threshold function. Proofs of the properties on which the steps of the ISTHRESHOLD procedure are based are given in Appendix II.

The input to the ISTHRESHOLD procedure is a BDD $F=xF_x+x'F_{x'}$, where x is a variable associated with a node pointed to by F. Alternatively, the input is a MLFT node. If F is not a threshold function, then ISTHRESHOLD returns $\phi$ (nil), otherwise ISTHRESHOLD returns a valid set of weights W and a threshold T defining a threshold function that constitutes the Boolean function F. W is a dictionary with the care variables of F as keys and weights of the care variables as values, and T is the threshold of the threshold function. W[x] represents the weight of variable x. The ISTHRESHOLD procedure makes use of the weights and thresholds of $F_x$ and $F_{x'}$ to determine the weights and threshold of F. This can be done because ISTHRESHOLD partitions the problem of determining the property of being a threshold function into two sub-problems of determining the same property of the positive and negative cofactors of the Boolean function F.

Terminal cases: The ISTHRESHOLD procedure first considers the terminal cases that are computed in lines 2 and 3. If F=1, then the support set of F ($S_F$) is empty, and by default the sum over an empty set is defined to be 0. Hence, taking the threshold to be zero will result in the threshold inequality always being satisfied. Similarly, if F=0, then its sum is defined to be 0. Hence, setting the threshold to zero will result in the inequality not being satisfied.

In line 4, ISTHRESHOLD checks to see if the node was visited previously, and if the weight and threshold pair were computed. If so, ISTHRESHOLD returns the cached values.

Support Set and Cofactor Containment: Next, ISTHRESHOLD checks three necessary conditions for a threshold function. The first two are simple. Theorem 1 (Appendix II) states that a necessary condition for F to be threshold is that the support set of either one of the cofactors of F is contained in the support set of the other cofactor. Line 7 checks this condition. The second necessary condition is given in Theorem 2 (Appendix II) which states that one of the cofactors must be contained in the other cofactor. Line 8 checks this condition.

Check cofactors: Another necessary condition for F to be a threshold function is that the positive cofactor ($F_x$) and the negative cofactor ($F_{x'}$) are threshold functions (Theorem 3, Appendix II). This requires the recursive application of ISTHRESHOLD to $F_x$ and $F_{x'}$. This is accomplished by the code in lines 9 up to line 12. If either cofactor is not a threshold function, F is identified as being non-threshold, and ISTHRESHOLD returns $\phi$.

Cofactors with same weights: If ISTHRESHOLD reaches line 13, then it has been determined that $F_x$ and $F_{x'}$ are threshold functions. If the weights of $F_x$ and $F_{x'}$ are the same, then F is a threshold function. In this situation, Theorem 4 (Appendix II) shows how the weights and threshold of F can be assigned. Let $F_x=[W, T_{Fx}]$, $Fx'=[W, T_{Fx'}]$. Then $F=[W \cup \{w(x)=T_{Fx'}-T_{Fx}\}, T_{Fx'}]$. This means that the weight of the cofactor variable x of F is assigned the threshold of $F_{x'}$ minus the threshold of $F_x$, and the threshold of F is assigned the threshold of $F_{x'}$. After computing the weight and threshold of F, [W,T] is cached and returned. The code from line 13 through line 18 accomplishes this.

Cofactors with different weights: We now arrive at a situation where the weights of $F_x$ and $F_{x'}$ are not the same. If F is a threshold function, then the variables in $S_F$ must be ordered according to the wavy relation. This means that the variables in $S_{Fx}$ and $S_{Fx'}$ must have the same wavy ordering as in F. For any weight assignment to a threshold function F, if $|w_x|>|w_y|$ then $x \succcurlyeq y$, and if $|w_x|=|w_y|$ then $x \approx y$. This condition is tested in line 19, and if the ordering of weights among the variables in $F_x$ and $F_{x'}$ is different, then F is not a threshold function. Note that this is a pessimistic approach since if for some two variables a and b, if $|w_a|>|w_b|$ in $F_x$ and $|w_a|<|w_b|$ in $F_{x'}$, then we would declare F to be a non-threshold function, when in fact $a \approx b$ in both $F_x$ and $F_{x'}$. Procedure DIFFWAVYORDERING checks to see if the weights of cofactors have a different wavy ordering. This is on line 19 of ISTHRESHOLD.

Cofactors with same wavy ordering: If F is a threshold function, then there exists an assignment of identical weights to $F_x$ and $F_{x'}$. Therefore, when the weights of $F_x$ and $F_{x'}$ are not the same, but they both have the same $\succcurlyeq$-ordering, ISTHRESHOLD attempts to equalize their weights. This final step is on line 20 of ISTHRESHOLD and is performed by the procedure TRYEQUALIZEWEIGHTS.

FIG. 16 depicts pseudo-code for the TRYEQUALIZEWEIGHTS procedure according to one embodiment of the present disclosure. As discussed above, TRYEQUALIZEWEIGHTS is called by ISTHRESHOLD in order to try to equalize the weights of the cofactors $F_x$ and $F_{x'}$ of the function F. The function, or procedure, TRYEQUALIZEWEIGHTS attempts to equalize the weights of $F_x$ and $F_{x'}$ in the following ways. First the support sets $S_{Fx}$ and $S_{Fx'}$ of the two cofactors are checked for equivalence (line 3 of TRYEQUALIZEWEIGHTS). If the support sets $S_{Fx}$ and $S_{Fx'}$ of the two cofactors are different, TRYEQUALIZEWEIGHTS attempts to re-synthesize the weights of one cofactor. This is performed by a function, or procedure, RESYNTHESIZEWEIGHTS (line 4 of TRYEQUALIZEWEIGHTS). Note that non-equivalence means that one support set is fully contained in the other, as ensured by line 7 of ISTHRESHOLD. If RESYNTHESIZEWEIGHTS succeeds, then the weights and threshold of F are returned. If RESYNTHESIZEWEIGHTS fails (i.e., RESYNTHESIZEWEIGHTS returns $\phi$), then TRYEQUALIZEWEIGHTS continues execution at line 25.

If the support sets $S_{Fx}$ and $S_{Fx'}$ of the two cofactors are the same, TRYEQUALIZEWEIGHTS checks if the weights assigned to $F_x$ are a valid assignment for $F_{x'}$ and vice-versa (line 9 through line 24). The test of validity is performed by procedure GETVALIDTHRESHOLDS, which takes a weight vector W and a threshold function F and returns an interval of threshold values such that W and any value of a threshold in the interval serves as a valid weight-threshold assignment for F.

Suppose that $W_x$, which is a weight assignment to $F_x$, is a valid set of weights for $F_{x'}$, and the threshold interval returned by GETVALIDTHRESHOLDS is [L,U]. By Theorem 4 (Appendix II), a valid threshold assignment to F will be the threshold of $F_{x'}$. The minimum valid threshold for $F_{x'}$ returned by GETVALIDTHRESHOLDS is L. Hence the threshold of F is set to L in line 15. Also, by Theorem 4 (Appendix II), the weight of the variable at node F is $T_{x'}-T_x=L-T_x$. This is performed on line 14. If $W_x$ is not a valid set of weights for $F_{x'}$, then GETVALIDTHRESHOLDS will return $\phi$, and TRYEQUALIZEWEIGHTS checks if $W_{x'}$ is a valid set of weights for $F_x$. This situation is similar and is shown in lines 18 through 24.

If the cofactor weights have not been equalized thus far, then TRYEQUALIZEWEIGHTS checks if the sum $W_x+W_{x'}$ is valid for both $F_x$ and $F_{x'}$. In checking if the sum of weights is valid for both, two intervals are returned: $[L_1,U_1]$ (line 21) when checking if the sum is valid of $F_x$, and $[L_0,U_0]$ (line 23) when checking if the sum is valid for $F_{x'}$.

If neither is empty, then F is a threshold function and a weight and threshold can be assigned to F. The weights will simply be $W_x+W_{x'}$. To determine the threshold of F, recall from the description of weight-threshold assignment above, the weight that is assigned to the cofactor variable x of F, namely W[x], is $T_{x'}-T_x$, and the threshold is $T=T_{x'}$. In procedure TRYEQUALIZEWEIGHTS, the threshold interval for Fx is $[L_1,U_1]$, and for $F_{x'}$ it is $[L_0,U_0]$. Hence the least value of T will be $L_0$, the least value for W[x] is $L_0-U_1$. These computations are shown in line 25.

FIG. 17 depicts pseudo-code for procedure GETVALIDTHRESHOLDS according to one embodiment of the present disclosure. In general, procedure GETVALIDTHRESHOLDS checks whether or not a given set of weights is a valid assignment to a given function.

Procedure GETVALIDTHRESHOLDS recursively checks if a given set of weights are valid for a function and returns an interval of valid threshold values for the given weights. An empty interval means that the weights are not valid. Note that two operations on intervals are used. The addition of a single value to an interval is defined as [L,U]+c=[L+c,U+c]. The intersection of two intervals is an interval representing their overlap.

Consider the terminal case of F=1, and w.l.o.g let $W=(w_1, w_2, \ldots, w_i, -w_{i+1}, -w_{i+2}, \ldots w_n)$. Consider the inequality $$w_1x_1+w_2x_2+\ldots-w_{i+1}x_{i+1}-w_{i+2}x_{i+2}-\ldots-w_nx_n \geq T.$$

Clearly if F=1, then the above inequality must evaluate true for all values of x. This will be the case if T is less than the minimum possible value of the expression on the left-hand-side (LHS), which will be the sum of all negative weights. Hence the valid interval for T is $[-\infty, \Sigma_{x|w[x]<0} W[x]]$. This is shown in line 2. The reasoning for the case of F=0 is similar, and is shown on line 3.

The next test on line 4 ensures that the sum of the absolute weights of don't care variables is less than the minimum of the absolute weights of all the care variables (Lemma 2, Appendix II). The second test on line 6 ensures that the absolute weight of every care variable is strictly non-zero (Lemma 3, Appendix II).

After having dispensed with the terminal cases, procedure GETVALIDTHRESHOLDS is recursively applied to each cofactor. The result will be two intervals $I_1$ and $I_0$, corresponding to the application of GETVALIDTHRESHOLDS to $F_x$ and $F_{x'}$. Since we are checking for the validity of a given set of weights, the weight of the cofactor variable x of F, denoted by W[x], is already given. Recall that the weight assignment in ISTHRESHOLD computes this value as $W[x]=T_{x'}-T_x$. Therefore, $T_{x'}=W[x]+T_x$. Interval $I_1$ represents the values for $T_x$, and $I_0$, the values for $T_{x'}$. Since both must satisfied, the interval of thresholds associated with F is $(I_1+Wx]) \cap I_0$. This is the interval returned at line 11 by GETVALIDTHRESHOLDS.

FIG. 18 depicts pseudo-code for procedure RESYNTHESIZEWEIGHTS according to one embodiment of the present disclosure. RESYNTHESIZEWEIGHTS relies on the fact that the weights of a threshold function depend on the set of don't care variables. For instance, consider the function F=abvc. Then, $S_F=\{a, b, c\}$. If no don't care variables are specified, then one valid weight assignment for F would be $W=[w_a=1, w_b=1, w_c=2]$ and T=2. This corresponds to the inequality $F \equiv a+b+2c \geq 2$. Now consider the same function, but with two variables d and e specified as don't care variables with weights $w_d=-5$ and $w_e=3$. In this case, one set of valid weights would be $W=[w_a=9, w_b=9, w_c=18, w_d=-5, w_e=3]$ and $T=13$, which corresponds to the inequality $F \equiv 9a+9b+18c-5d+3e \geq 13$. Thus don't care variables affect the weight-threshold assignment.

As stated before, procedure RESYNTHESIZEWEIGHTS is called when $S_{Fx} \neq S_{Fx'}$. For definiteness, suppose $S_{Fx} \supset S_{Fx'}$ (line 5 of RESYNTHESIZEWEIGHTS). In this case, some variables in $F_x$ are don't care variables in $F_{x'}$. In such a situation, the care variables in $F_{x'}$ can be assigned weights conditional on the weights of its don't care variables that were assigned values in $F_x$. Lemma 2 (Appendix II) states that the minimum weight of a care variable must be at least one more than the sum of the magnitudes of the weights of the don't care variables. This quantity is used to scale the weights of the care variables in $F_{x'}$ (line 8). This scaling is done by multiplying each weight and the threshold by a constant.

The scaled weights and the corresponding threshold (line 9) will always be valid for $F_{x'}$. Next, a test is made to check if these new weights $W_x'^{new}$ are valid for F using GETVALIDTHRESHOLDS (line 10). If they are, then both cofactors now have the same set of weights, and as before, the new weights and threshold of F are calculated and returned.

We now describe an alternate data structure, which is referred to as a MLFT. An MLFT is more efficient and accurate for identifying threshold functions. An MLFT is a decision diagram similar to a BDD, and the processes discussed above (particularly those of FIGS. 14 through 18) remain exactly the same when operating on an MLFT instead of a BDD. There are several important characteristics of an MLFT that should be noted.

1) An MLFT is a factor tree that can be constructed from a SOP representation that is minimal with respect to single cube containment.
2) Unlike a BDD, no particular ordering of variables can be associated with an MLFT of an arbitrary function.
3) However, a well defined ordering of variables, which we refer to as a max literal (ML) ordering, can be associated with an MLFT of a threshold function F. The BDD of a threshold function with its variables ordered according to the ML ordering is the same as an MLFT.

The construction of an MLFT is as follows. First, without loss of generality, we assume that F is a positive unate function and F is given in the form of an SOP that is minimal with respect to single cube containment. The result of dividing F by a literal x is a pair of functions (Q, R) such that $F=xQ+R$. Here, x is the divisor, Q is the quotient, and R is the remainder. The MLFT of F is obtained by repeated algebraic division of F using max literals as divisors at each step of the division. In an MLFT, the factored form $F=xQ+R$ is represented by a binary tree, where the root node is labeled by x, and its left and right children are the MLFT of Q and R respectively. The process stops when both quotient and remainder are the constant functions 1 or 0. Note, unlike a BDD, the ML ordering of Q and R might be different, and hence no particular ordering can be associated with an MLFT of a non-threshold function.

Figure 19:
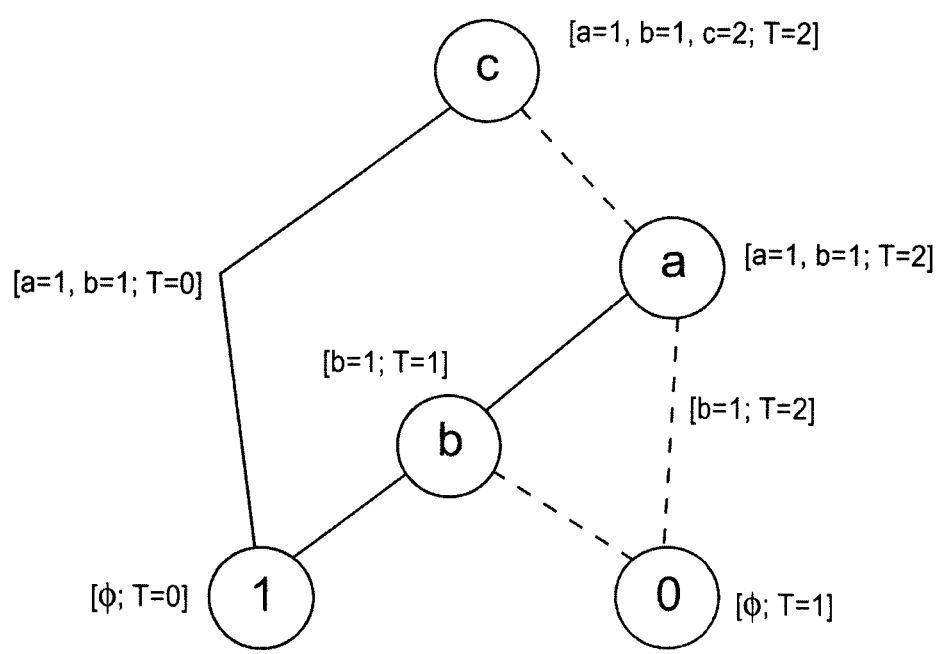
FIG. 19 depicts an exemplary Max Literal Factor Tree (MLFT) according to one embodiment of the present disclosure.

Consider $F=ab+c$. The ML ordering is $c<a<b$. The MLFT of F is obtained by the following factorization: $F=c(1)+[a(b)+0]$. FIG. 19 shows the MLFT of F. This is the same as the BDD for the ordering $c<a<b$ because F is a threshold function.

When synthesizing a threshold network, the first time that a node F is determined to be a non-threshold function, it will be with both of its cofactors being threshold functions. This is because the ISTHRESHOLD proceeds bottom-up and leaf nodes are always threshold functions. At this point, one or both of the cofactors can be substituted by a literal which will represent the output of a threshold gate. The rules for substitution vary for an MLFT and a BDD.

Figure 20A:
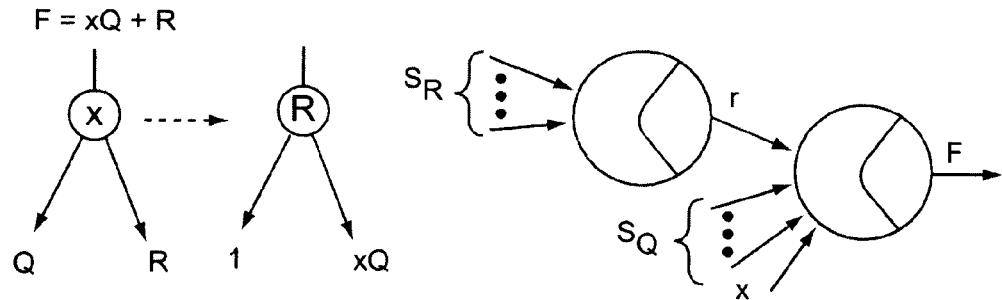
FIGS. 20A and 20B depict a transformation of an exemplary node of a MLFT identified as a non-threshold function into a threshold function according to one embodiment of the present disclosure.
Figure 20B:
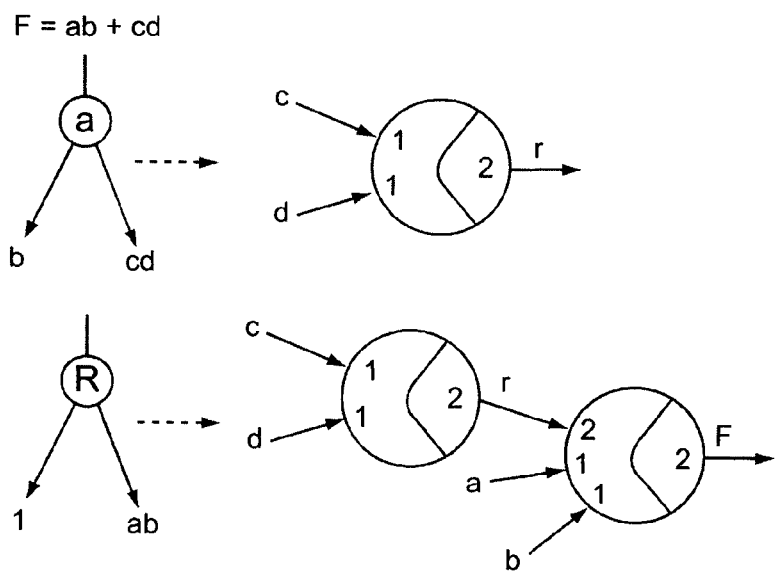

Consider an MLFT node $F=xQ+R$, where Q and R are threshold functions and F is not. Since xQ is also a threshold function, we can substitute either xQ or R. Suppose R is substituted by a literal r. This means that the function R is implemented as a threshold gate and the literal r denotes its output. Therefore, the new MLFT would be $F=r+xQ$, which is a threshold function whose support set is $\{r, x\} \cup S_Q$. After this transformation, the threshold identification procedure can proceed toward the root. FIGS. 20A and 20B show the transformation (i.e., the substitution rule), and its application to the function $F=ab+cd$. $R=cd=[w_c=1, w_d=1; T=2]$, $F=r+ab=[w_r=2, w_a=1, w_b=1; T=2]$, respectively. Similarly, if xQ is implemented by a threshold gate, whose output is denoted by the literal h, then $F=h+R$ is a threshold function.

Figure 21A:
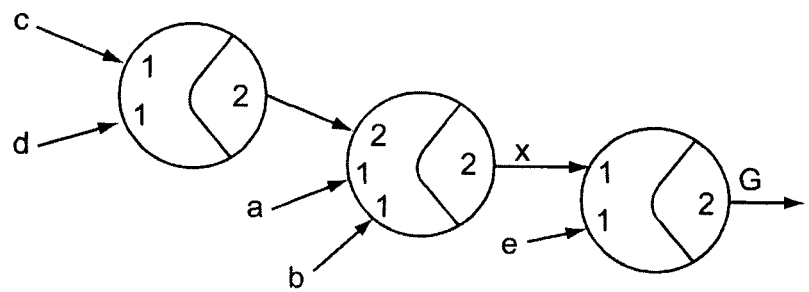
FIGS. 21A and 21B depict a transformation of an exemplary node of a MLFT identified as a non-threshold function into a threshold function according to one embodiment of the present disclosure.
Figure 21B:
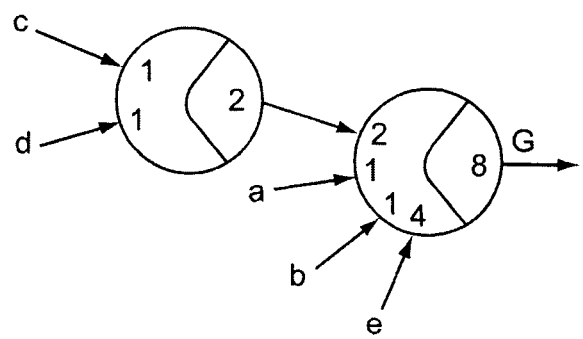

Now consider the function $G=e(ab+cd)$. In this case, we let $x=ab+cd$ and $G=ex$. From FIG. 20B we see that (ab+cd) requires two threshold gates. FIGS. 21A and 21B show two possible implementations for G. In FIG. 21A, x and e are fed as inputs to a third threshold gate; and in FIG. 21B, e is merged into the threshold gate that produced x. As is apparent, these implementations differ in the number of gates and levels, the maximum fanin, and maximum weight and threshold.

The substitution rules in the case of BDDs are similar. Consider the BDD node $F=xF_x+x'F_{x'}$, and assume that $F_x$ and $F_{x'}$ are threshold functions, but F is not a threshold function. The substitution can be done in one of three ways:
(1) implement $y=F_x$ and $z=x'F_{x'}$ with two separate threshold gates with node $F=xy+z$ becoming a new threshold function $F=[w_x=1, w_y=1, w_z=2; T=2]$, or
(2) implement $y=xF_x$ and $z=F_{x'}$ with two separate threshold gates with node $F=x'z+y$ becoming a new threshold function $F=[w_{x'}=1, w_y=2, w_z=1; T=2]$, or
(3) implement $y=xF_x$ and $z=x'F_{x'}$ by two threshold gates with $F=y+z$ becoming a new threshold function $F=[w_y=1, w_z=1; T=1]$. As with MLFTs, these choices lead to differences in gates, levels, weights, and thresholds.

The choice of the substitution will impact the overall area, power, and performance of the network. In fact, with certain circuit architectures of threshold gates such as those that use differential logic, the maximum weight and threshold values have a strong impact on the reliability of the gate.

Here, the choice for the substitution is based on reducing the number of gates. However, the present disclosure is not limited thereto. Any of the aforementioned criteria or combination of the aforementioned criteria may be used.

Although in this disclosure synthesis has been discussed in detail, the threshold function identification processes described herein are not limited thereto. For example, detection of threshold functions is an often recurring problem in threshold CAD, and the threshold function identification processes described herein can be used with or replace existing approaches for detecting a threshold function.

As outlined before, scaling is currently the most popular technique used to improve performance metrics of Complementary Metal Oxide Semiconductor (CMOS) circuits. This cannot go on forever, because the properties that are responsible for the functioning of Metal Oxide Semiconductor Field Effect Transistors (MOSFETs) no longer hold in nano dimensions. Recent research into nano-devices has shown that nano-devices can be an alternative to CMOS when scaling of CMOS becomes infeasible in the near future. This is motivating the need for stable and mature design automation techniques for threshold logic since it is the design abstraction used for most nano-devices. The present disclosure provides a new decomposition theory that is based on the properties of threshold functions. The systems and processes disclosed herein can also be applied to design efficient CMOS circuits that are based on threshold logic. Some contributions of this work are a new method of algebraic factorization called the Min-Max Literal factorization or Max Literal Factorization, a decomposition theory that uses this new factorization to identify and characterize threshold functions, and a new threshold logic synthesis methodology that uses the decomposition theory. The processes disclosed herein can also work with any traditional representations of cofactoring like BDD and its many variants.

Further described herein is a novel theory for decomposition of Boolean functions into constituent threshold functions. New properties of threshold functions are introduced. Using these properties, a decomposition procedure is developed to identify and assign weights and threshold to a threshold function. A new algebraic factorization for factoring Boolean functions, which can be used in conjunction with the proposed procedure, is presented. A new synthesis procedure is built on top of the decomposition theory. This procedure has sound theoretical basis as opposed to other heuristic node merging algorithms. When compared to the most recent synthesis procedure, the method outlined herein generates threshold circuits that have an average of 27% fewer gates with comparable circuit depth.

Those skilled in the art will recognize improvements and modifications to the preferred embodiments of the present disclosure. All such improvements and modifications are considered within the scope of the concepts disclosed herein and the claims that follow.

APPENDIX I

Lemma 1: If $F=xF_x+x'F_{x'}$ is a Boolean function, and $F_x$ and $F_{x'}$ are known to be threshold, with a weight-threshold assignment [W; T ($F_x$)] and [W; T($F_{x'}$)] (identical input weights) respectively, then F is also a threshold function with $w_x=T(F_{x'})-T(F_x)$ and $F \equiv [W \cup \{T(F_{x'})-T(F_x)\}; T(F_{x'})]$.

Lemma 2: In all weight-threshold assignments of a positive threshold function, the don't care variables have weight strictly less than all other non-don't care variables.

Let $F=xF_x+x'F_{x'}$ (in case of a MML factor tree $F=xF_x+F_{x'}$), where x is the cofactoring variable. Lemma 3, 4, and 5 discuss some properties of this functional representation of F.

Lemma 3: There exists a weight-threshold assignment of $F_x$ and $F_{x'}$; such that both $F_x$ and $F_{x'}$ have the same variable weights.

Lemma 4: Both A and B have the same $\succcurlyeq$-ordering of variables. (NOTE: For a function F if $F_{x=1, y=0} \supset F_{x=0, y=1}$, it is denoted as $x \succcurlyeq y$. $x \preccurlyeq y$ is defined similarly. If $F_{x=1, y=0} \supset F_{x=0, y=1}$, it is denoted as $x \succ y$. $x \prec y$ is defined similarly.

For a pair of variables x and y, if $x \succcurlyeq y$ and $x \preccurlyeq y$, it is denoted as $x \approx y$.

Lemma 5: If $Supp(F_x) \backslash Supp(F_{x'}) \neq \phi$ and $Supp(F_{x'}) \backslash Supp(F_x) \neq \phi$, then F is not a threshold function.

Lemma 6: If f (X) is a threshold function and has a weight threshold assignment $[\{w_1 \ldots w_{a-1}, w_a, w_{a+1}, \ldots, w_n\}; T]$, then for $f(X; a \rightarrow a')$, $[\{w_1, \ldots w_{a-1}, -w_a, w_{a+1}, \ldots w_n\}; T-w_a]$ is a feasible weight threshold assignment.

APPENDIX II

Lemma 1. If F(X) is a threshold function and has a weight threshold assignment $[\{w_1, \ldots w_{a-1}, w_a, w_{a+1}, \ldots, w_n\}; T_F]$, then for $F(X; a \rightarrow a')$, $[\{w_1, \ldots w_{-1}, -w_a, w_{a+1}, \ldots, w_n\}; T_F-w_a]$ is a feasible weight threshold assignment.

Proof: S. Muroga. *Threshold Logic and Its Applications*. New York: Wiley-Interscience, 1971, page 58.

Definition 1. The positive form of weight assignment of a threshold function is the weight assignment obtained by the repeated application of Lemma 1, such that all the input weights are positive.

Lemma 2. Let F be a threshold function. Then for any weight-threshold assignment [W,T] to F $$\sum_{x \notin Supp(F)} |w_x| < \min_{y \in Supp(F)} \{|w_y|\}. \quad (1)$$

Proof: (By contradiction) Let D denote the set of don't care variables of F. Assume the contrary that $$\sum_{x \in D} |w_x| \geq |w_y|, \text{ for some } y \in Supp(F). \quad (2)$$

Let $P_y$ be a prime implicant of F that contains y. Therefore $$\sum_{v \in P_y} w_v \geq T \equiv \sum_{\substack{v \in P_y \\ v \neq y}} w_v + w_y \geq T. \quad (3)$$

Combining Equations (2) and (3), we obtain $$\sum_{v \in P_y} w_v + \sum_{x \in D} |w_x| \geq \sum_{v \in P_y} w_v + |w_y| \text{ by } (2) \geq \sum_{v \in P_y} w_v + w_y \geq T \text{ by } (3). \quad (4)$$

Let $P^*_y = P_y \backslash \{y\} \cup D$. $P^*_y$ is the cube obtained from $P_y$ after removing y and including all the variables in D in positive form. Equation (4) implies that the cube $P^*_y$, in which all the don't care variables are set to 1, is an implicant of F. By definition of don't care variables, this implies that the cube $P_y \backslash \{y\}$, in which all the don't care variables are set to 0, is also an implicant of F. This contradicts the fact that $P_y$ is a prime implicant of F.

Lemma 3. Let F be a threshold function. Then for any weight-threshold assignment [W,T] to F, $\forall a \in Supp(F)$, $|w_a| > 0$.

Proof: (By contradiction) If $|w_a| \not> 0$, then $w_a=0$. In this case $w_a$ does not affect the weighted sum whether a=1 or a=0. Thus the output of F is not affected when a=1 or a=0. Thus a∈Supp(F) (by definition of a don't care variable). This is a contradiction and hence the lemma is proved.

Lemma 4. If $F=xF_x+x'F_{x'}$ is a threshold function, then there exists a weight-threshold assignment for $F_x$ and $F_{x'}$ such that they have the same variable weights.

Proof: If $F=[W;T_F]$, then (by the definition of cofactors) $F_x \equiv [W \backslash \{w_x\}; T_F-w_x]$ and $F_{x'} \equiv [W \backslash \{w_x\}; T_F]$. Note that variable weights for both $F_x$ and $F_{x'}$ are the same input weights ($W \backslash \{w_x\}$).

Theorem 1. If $F=x \cdot F_x+x' \cdot F_{x'}$ is a Boolean function and if $Supp(F_x) \backslash Supp(F_{x'}) \neq \phi$ and $Supp(F_{x'}) \backslash Supp(F_x) \neq \phi$, then F is not a threshold function.

Proof: Suppose F is a threshold function. Since $Supp(F_x) \backslash Supp(F_{x'}) \neq \phi$, $\exists a \in Supp(F_x) \backslash Supp(F_{x'})$. Similarly ∃b∈Supp($F_{x'}$)\Supp($F_x$). The variable a is a don't care variable for $F_{x'}$, and b is a don't care variable for $F_x$. By Lemma 4, there exists a weight-threshold assignment for F in which a has the same weight in $F_x$ and $F_{x'}$, as does b. By Lemma 2, $|w_b|<|w_a|$ in $F_x$ because b is a don't care variable in $F_x$. Similarly, since a is a don't care variable in $F_{x'}$, $|w_a|<|w_b|$. These contradict Lemma 4, because it holds true for all weight-threshold assignments. Hence, the statement of the theorem is true.

Theorem 2. If F=x$F_x$+x'$F_{x'}$, is a threshold function, then either $F_x \subseteq F_{x'}$ or $F_{x'} \subseteq F_x$.

Proof: By Lemma 4, there exists a set of weights W such that $F_x \equiv \lfloor w_1 \ldots, w_n; T_{F_x} \rfloor$ and $F_{x'} \equiv \lfloor w_1 \ldots, w_n; T_{Fx'} \rfloor$. If $T_{F_x} > T_{F_{x'}}$, then every one-point of $F_x$ is a one-point of $F_{x'}$ (by definition of a threshold function). Therefore $F_x \subseteq F_{x'}$. Similarly, if $T_{F_{x'}} > T_{F_x}$, then $F_{x'} \subseteq F_x$.

Theorem 3. If F=x·$F_x$+x'·$F_{x'}$ is a threshold function then $F_x$ and $F_{x'}$ are also threshold functions.

Proof: If F is a threshold function then ∃[W;$T_F$], that implements F (by definition of threshold logic). Now $F_x \equiv [W\backslash\{w_x\}; T_F - w_x]$ and $F_{x'} \equiv [W\backslash\{w_x\}; T_F]$ (by definition of cofactors). Since there exists a weight-threshold assignment that implements $F_x$ and $F_{x'}$, they are both threshold.

Theorem 4. Let F=x$F_x$+x'$F_{x'}$ be a Boolean function, and suppose that $F_x$ and $F_{x'}$ are threshold functions with weight-threshold assignments $\lfloor W, T_{F_x} \rfloor$ and $\lfloor W, T_{F_{x'}} \rfloor$ (identical weights), respectively. Then F is a threshold function with $w_x = T_{F_{x'}} - T_{F_x}$, and $F = \lfloor W \cup W_x, T_{F_{x'}} \rfloor$.

Proof: Let X=($x_1, x_2, \ldots, x_n$). We need to show that $F(X)=1 \Rightarrow \Sigma_{x_i \in X} w_i x_i \geq T_F$, and $F(X)=0 \Rightarrow \Sigma_{x_i \in X} w_i x_i < T_F$. Applying the Shannon decomposition w.r.t $x_i$, $F = x_i F_{x_i} + x'_i F_{x'_i}$.

$F(X) = 1.$ Case 1
If
$x_i = 1$
then $F(X) = 1 \Rightarrow F_x(X \backslash x_i)$ $= 1 \Rightarrow \sum_{x_j \in (X \backslash x_i)} w_j x_j \geq T_{F_{x_i}} \Rightarrow \sum_{x_j \in (X \backslash x_i)} w_j x_j +$ $\left(T_{F_{x'_i}} - T_{F_{x_i}}\right) x_i \geq T_{F_{x'_i}} \Rightarrow \sum_{x_j \in X} w_j x_j \geq T_F$ since $w_i = \left(T_{F_{x'_i}} - T_{F_{x_i}}\right)$ and $T_F = T_{F_{x'_i}}$.

If
$x_i = 0$
then $F(X) = 1 \Rightarrow F_{x'}(X \backslash x_i)$ $= 1 \Rightarrow \sum_{x_j \in (X \backslash x_i)} w_j x_j \geq T_{F_{x'_i}} \Rightarrow \sum_{x_j \in (X \backslash x_i)} w_j x_j +$ $\left(T_{F_{x'_i}} - T_{F_{x_i}}\right) x_i < T_{F_{x'_i}} \Rightarrow \sum_{x_j \in X} w_j x_j < T_F.$ -continued $F(X) = 0.$ Case 2
If
$x_i = 1$
then $F(X) = 0 \Rightarrow F_x(X \backslash x_i)$ $= 0 \Rightarrow \sum_{x_j \in (X \backslash x_i)} w_j x_j \geq T_{F_{x_i}} \Rightarrow \sum_{x_j \in (X \backslash x_i)} w_j x_j +$ $\left(T_{F_{x'_i}} - T_{F_{x_i}}\right) x_i \geq T_{F_{x'_i}} \Rightarrow \sum_{x_j \in X} w_j x_j \geq T_F.$ If
$x_i = 0$
then $F(X) = 0 \Rightarrow F_{x'}(X \backslash x_i)$ $= 0 \Rightarrow \sum_{x_j \in (X \backslash x_i)} w_j x_j \geq T_{F_{x'_i}} \Rightarrow \sum_{x_j \in (X \backslash x_i)} w_j x_j +$ $\left(T_{F_{x'_i}} - T_{F_{x_i}}\right) x_i < T_{F_{x'_i}} \Rightarrow \sum_{x_j \in X} w_j x_j < T_F.$

What is claimed is:

1. A method implemented in a computer system comprising a processor, comprising:
   determining, by the processor, that a Boolean function satisfies one or more predefined conditions for being a threshold function, the one or more predefined conditions comprising a condition that both a positive cofactor and a negative cofactor of the Boolean function are threshold functions;
   determining, by the processor, that weights for the positive cofactor are equal to weights for the negative cofactor, the weights for the positive cofactor being weights that together with a threshold value for the positive cofactor define a threshold function that corresponds to the positive cofactor and the weights for the negative cofactor being weights that together with a threshold value for the negative cofactor define a threshold function that corresponds to the negative cofactor;
   identifying, by the processor, the Boolean function as a threshold function in response to determining that the Boolean function satisfies the one or more predefined conditions for being a threshold function and determining that the weights for the positive cofactor are equal to the weights for the negative cofactor; and
   determining, by the processor, weights and a threshold value that characterize a threshold logic gate that implements the threshold function corresponding to the Boolean function based on the weights and the threshold values for the positive cofactor and the negative cofactor.

2. The method of claim 1 wherein the one or more predefined conditions for being a threshold function further comprise a condition that a support set for one of the positive and negative cofactors contain a support set of the other one of the positive and negative cofactors.

3. The method of claim 1 wherein the one or more predefined conditions for being a threshold function further comprise a condition that one of the positive and negative cofactors be contained by the other one of the positive and negative cofactors.

4. The method of claim 1 wherein the one or more predefined conditions for being a threshold function further comprise a condition that the weights for the positive and negative cofactors have the same wavy ordering.

5. The method of claim 1 wherein the Boolean function is a sub-function of another Boolean function.

6. A method implemented in a computer system comprising a processor, comprising:
    determining, by the processor, that a Boolean function satisfies one or more predefined conditions for being a threshold function, the one or more predefined conditions comprising a condition that both a positive cofactor and a negative cofactor of the Boolean function are threshold functions;
    determining, by the processor, that weights for the positive cofactor and weights for the negative cofactor are not equal, the weights for the positive cofactor being weights that together with a threshold value for the positive cofactor define a threshold function that corresponds to the positive cofactor and the weights for the negative cofactor being weights that together with a threshold value for the negative cofactor define a threshold function that corresponds to the negative cofactor;
    equalizing, by the processor, the weights for the positive and negative cofactors in response to determining that the weights for the positive cofactor and the weights for the negative cofactor are not equal;
    identifying, by the processor, the Boolean function as a threshold function in response to determining that the Boolean function satisfies the one or more predefined conditions and equalizing the weights for the positive and negative cofactors; and
    determining, by the processor, weights and a threshold value that characterize a threshold logic gate that implements the threshold function corresponding to the Boolean function based on the weights and the threshold values for the positive cofactor and the negative cofactor.

7. The method of claim 6 further comprising, prior to equalizing the weights for the positive and negative cofactors:
    determining that a wavy ordering of the weights for the positive and negative cofactors are not different; and
    in response to determining that the wavy ordering of the weights for the positive and negative cofactors are not different, proceeding to the step of equalizing the weights for the positive and negative cofactors.

8. The method of claim 6 wherein equalizing the weights for the positive and negative cofactors comprises:
    determining that support sets of the positive and negative cofactors are not equal; and
    in response to determining that the support sets of the positive and negative cofactors are not equal, resynthesizing the weights for one of the positive and negative cofactors using don't care variables to equalize the weights for the positive and negative cofactors.

9. The computerized method of claim 6 wherein equalizing the weights for the positive and negative cofactors comprises:
    determining that support sets of the positive and negative cofactors are equal;
    in response to determining that the support sets of the positive and negative cofactors are equal, determining that the weights for one of the positive and negative cofactors are valid for the other one of the positive and negative cofactors; and
    in response to determining that the weights for one of the positive and negative cofactors are valid for the other one of the positive and negative cofactors, setting the weights for the other one of the positive and negative cofactors equal to the weights for the one of the positive and negative cofactors.

10. The method of claim 6 wherein equalizing the weights for the positive and negative cofactors comprises:
    determining that support sets of the positive and negative cofactors are equal;
    in response to determining that the support sets of the positive and negative cofactors are equal, determining that a sum of the weights for the positive and negative cofactors is a valid set of weights for both the positive and negative cofactors; and
    in response to determining that the sum of the weights for the positive and negative cofactors is a valid set of weights for both the positive and negative cofactors, setting the weights for both the positive and negative cofactors equal to the sum of the weights for the positive and negative cofactors.

11. A non-transitory computer readable medium storing software for instructing a controller of a computing device to:
    determine that a Boolean function satisfies one or more predefined conditions for being a threshold function, the one or more predefined conditions comprising a condition that both a positive cofactor and a negative cofactor of the Boolean function are threshold functions;
    determine that weights for the positive cofactor are equal to weights for the negative cofactor, the weights for the positive cofactor being weights that together with a threshold value for the positive cofactor define a threshold function that corresponds to the positive cofactor and the weights for the negative cofactor being weights that together with a threshold value for the negative cofactor define a threshold function that corresponds to the negative cofactor;
    identify the Boolean function as a threshold function in response to determining that the Boolean function satisfies the one or more predefined conditions for being a threshold function and determining that the weights for the positive cofactor are equal to the weights for the negative cofactor; and
    determine weights and a threshold value that characterize a threshold logic gate that implements the threshold function corresponding to the Boolean function based on the weights and the threshold values for the positive cofactor and the negative cofactor.

* * * * *